United States Patent
Endo et al.

(10) Patent No.: US 11,884,839 B2
(45) Date of Patent: Jan. 30, 2024

(54) ACETAL-PROTECTED SILANOL GROUP-CONTAINING POLYSILOXANE COMPOSITION

(71) Applicant: NISSAN CHEMICAL CORPORATION, Tokyo (JP)

(72) Inventors: Yuki Endo, Toyama (JP); Hiroaki Yaguchi, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1005 days.

(21) Appl. No.: 16/329,175

(22) PCT Filed: Aug. 28, 2017

(86) PCT No.: PCT/JP2017/030753
§ 371 (c)(1),
(2) Date: Feb. 27, 2019

(87) PCT Pub. No.: WO2018/043407
PCT Pub. Date: Mar. 8, 2018

(65) Prior Publication Data
US 2019/0185707 A1  Jun. 20, 2019

(30) Foreign Application Priority Data
Aug. 29, 2016  (JP) .................. 2016-167251

(51) Int. Cl.
| G03F 7/40 | (2006.01) |
| G03F 7/004 | (2006.01) |
| G03F 7/075 | (2006.01) |
| G03F 7/11 | (2006.01) |
| C08G 77/38 | (2006.01) |
| C09D 183/04 | (2006.01) |
| C08G 77/18 | (2006.01) |
| C08G 77/00 | (2006.01) |

(52) U.S. Cl.
CPC ........... *C09D 183/04* (2013.01); *C08G 77/18* (2013.01); *C08G 77/38* (2013.01); *G03F 7/0045* (2013.01); *G03F 7/0752* (2013.01); *G03F 7/0757* (2013.01); *G03F 7/11* (2013.01); *G03F 7/40* (2013.01); *C08G 77/80* (2013.01)

(58) Field of Classification Search
None
See application file for complete search history.

(56) References Cited

U.S. PATENT DOCUMENTS

| 5,691,396 A * | 11/1997 | Takemura ............... C08G 77/38 522/62 |
| 5,976,626 A * | 11/1999 | Matsubara .......... H01L 23/5329 438/782 |
| 2008/0008954 A1 | 1/2008 | Abdallah et al. |
| 2009/0269697 A1* | 10/2009 | Kato ..................... G03F 7/0757 528/25 |
| 2016/0266491 A1* | 9/2016 | Seino ..................... C08G 77/16 |

FOREIGN PATENT DOCUMENTS

| CN | 101472996 A | 7/2009 |
| JP | H04-345841 A | 12/1992 |
| JP | 07-258414 | * 10/1995 |
| JP | 08-190200 | * 7/1996 |
| JP | 09-040779 | * 2/1997 |
| JP | 09-087391 | * 3/1997 |
| JP | 11-060733 | * 3/1999 |
| JP | H11-130860 A | 5/1999 |
| JP | 2002-082437 A | 3/2002 |
| JP | 2004-212946 A | 7/2004 |
| JP | 2008-287176 A | 11/2008 |
| JP | 2009-263522 A | 11/2009 |
| JP | 2011-118373 A | 6/2011 |
| WO | 2016/052390 | * 4/2016 |
| WO | 2016/052390 A1 | 4/2016 |

OTHER PUBLICATIONS

Machine translation of 07-258414 (1995).*

(Continued)

*Primary Examiner* — Martin J Angebranndt
(74) *Attorney, Agent, or Firm* — Oliff PLC

(57) ABSTRACT

An acetal-protected polysiloxane composition, used as a photosensitive composition and a coating composition for forming a flat film on a substrate to be processed for performing pattern reversal. A coating composition or photosensitive composition including: a polysiloxane obtained from a hydrolysis-condensation product of a hydrolyzable silane having 2 to 4 hydrolyzable groups in a molecule by protecting the condensation product's silanol groups with acetal groups, wherein in the hydrolysis-condensation product, an organic group bonded to silicon atoms through Si—C bonds exists in molar ratio of 0≤(organic group)/(Si)≤0.29 on average. Method for producing semiconductor device, including steps: forming resist film on a semiconductor substrate; exposing resist film and developing resist after exposure to obtain resist pattern; applying the coating composition onto patterned resist film to embed the polysiloxane; curing the embedded polysiloxane and then etching resist film to reverse the pattern; and processing substrate using polysiloxane film.

13 Claims, No Drawings

(56) References Cited

OTHER PUBLICATIONS

Machine translation of JP 09-087391 (1997).*
Machine translation of JP 2009-263522 (2009).*
Machine translation of JP 2002-082437 (2002).*
Innocenzi et al., Structure and properties of Sol-Gel coatings from methyltriethoxysilane and tetraethoxysilane, J. Solo-Gel Sci. Technol. vol. 3,(1) 47-55 (Year: 1994).*
Oct. 10, 2017 International Search Report issued in International Patent Application No. PCT/JP2017/030753.
Oct. 10, 2017 Written Opinion of the International Searching Authority issued in International Patent Application No. PCT/JP2017/030753.

* cited by examiner

ACETAL-PROTECTED SILANOL GROUP-CONTAINING POLYSILOXANE COMPOSITION

TECHNICAL FIELD

The present invention relates to an acetal-protected silanol group-containing polysiloxane composition used for, for example, a photosensitive composition and a coating composition for pattern reversal for forming a fine pattern.

BACKGROUND ART

A technique for forming a fine pattern on a substrate and carrying out etching along with this pattern to process the substrate is widely used in the field of semiconductor production.

As lithography technology has progressed, fine pattern formation has progressed. KrF excimer laser and ArF excimer laser are used and exposure techniques using electron beams and EUV (extreme ultraviolet rays) have been studied.

As one of the pattern forming techniques, there is a pattern reversal method. A resist pattern is formed on a semiconductor substrate and the resist pattern is coated with a silicon-based coating liquid. This allows the spaces in the resist pattern to be filled with silicon-based coating liquid. Thereafter, the substrate is baked to form a coating film. Thereafter, the upper part of the silicon-containing coating film is etch-backed by etching with a fluorine-based gas to expose the upper part of the resist pattern and the resist pattern is removed with an oxygen-based etching gas, which is replaced from the fluorine-based gas. Consequently, the resist pattern disappears and the silicon-based pattern derived from the silicon-based coating film remains to reverse the pattern.

Etching of the underlayer of the silicon-based film or the substrate using the silicon-based film in which the reversed pattern is formed as an etching mask allows the reversed pattern to be transferred and the pattern is formed on the substrate.

As a pattern forming method utilizing such a reversed pattern, there is an invention in which a material using a polysiloxane formed by cohydrolyzing a silane having a hydrogen atom, a fluorine atom, a liner or branched alkyl group having a carbon number of 1 to 5, a cyano group, a cyanoalkyl group, an alkylcarbonyloxy group, an alkenyl group, or an aryl group with tetraethoxysilane and an ether-based solvent is utilized (Patent Document 1).

There is also an invention in which a material produced by using a polyalkylsiloxane is utilized (Patent Document 2).

A polysiloxane in which a part of the hydrogen atoms of the hydroxy groups directly bonded to silicon atoms are substituted with acetal groups and the acetal groups and the silicon atoms exist in a molar ratio of (acetal group)/(Si)≥0.3 and a photosensitive resin composition using the polysiloxane have been described (Patent Document 3).

PRIOR ART DOCUMENTS

Patent Documents

Patent Document 1: Japanese Patent Application Publication No. 2011-118373 (JP 2011-118373 A)
Patent Document 2: Japanese Patent Application Publication No. 2008-287176 (JP 2008-287176 A)
Patent Document 3: Japanese Patent Application Publication No. 2009-263522 (JP 2009-263522 A)

SUMMARY OF THE INVENTION

Problem to be Solved by the Invention

In the method for applying the polysiloxane composition for the pattern reversal onto the resist pattern, improvement in etching resistance at the time of obtaining the reversed pattern by eliminating the resist pattern with the oxygen-based gas is required. A polysiloxane composition having a high silicon content for improving the etching resistance may frequently cause a problem of storage stability.

Means for Solving the Problem

The present invention includes a polysiloxane composition having a high silicon content and the inventors of the present invention have found that both of the improvement in the etching resistance and improvement in the storage stability of the composition are simultaneously satisfied by protecting the silanol groups in the polysiloxane composition with acetal groups. The polysiloxane composition in which the silanol groups are protected with acetal groups has photosensitivity due to including an acid generator. The composition formed by combing the polysiloxane composition in which the silanol groups are protected with acetal groups with a photoacid generator may also be used as a photosensitive composition (resist).

The present invention provides a polysiloxane composition for the pattern reversal on the resist pattern and a photosensitive polysiloxane composition.

As a first aspect, the present invention includes a coating composition or a photosensitive composition comprising: a polysiloxane obtained from a hydrolysis-condensation product of a hydrolyzable silane having 2 to 4 hydrolyzable groups in a molecule by protecting silanol groups of the condensation product with acetal groups, in which, in the hydrolysis-condensation product, an organic group bonded to silicon atoms through Si—C bonds exists in a molar ratio of 0≤(the organic group)/(Si)≤0.29 on average.

As a second aspect, the present invention includes the coating composition or the photosensitive composition according to the first aspect, in which the hydrolyzable silane comprises a hydrolyzable silane of Formula (1):

$$R^1_a Si(R^2)_{4-a} \qquad \text{Formula (1)}$$

(in Formula (1), $R^1$ is an organic group having an alkyl group, an aryl group, a halogenated alkyl group, a halogenated aryl group, an alkoxyaryl group, an alkenyl group, an epoxy group, an acryloyl group, a methacryloyl group, a mercapto group, or a cyano group and is bonded to a silicon atom through a Si—C bond; $R^2$ is an alkoxy group, an acyloxy group, or a halogen group; and a is an integer of 0 to 3).

As a third aspect, the present invention includes the coating composition or the photosensitive composition according to the second aspect, in which the hydrolyzable silane of Formula (1) comprises any of a tetraalkoxysilane in which a is 0 in Formula (1), a methyltrialkoxysilane, a vinyltrialkoxysilane, or a phenyltrialkoxysilane in which a is 1 in Formula (1), or dimethyldialkoxysilane in which a is 2 in Formula (1).

As a fourth aspect, the present invention includes the coating composition or the photosensitive composition according to the second aspect, in which the hydrolyzable silane comprises a hydrolyzable silane in which a is 0 in Formula (1) in a ratio of 71 mol % to 100 mol % and a hydrolyzable silane in which a is 1 in Formula (1) in a ratio of 0 mol % to 29 mol %.

As a fifth aspect, the present invention includes the coating composition or the photosensitive composition according to the second aspect, in which the hydrolyzable silane comprises a hydrolyzable silane in which a is 0 in Formula (1) in a ratio of 85.5 mol % to 100 mol % and a hydrolyzable silane in which a is 2 in Formula (1) in a ratio of 0 mol % to 14.5 mol %.

As a sixth aspect, the present invention includes the coating composition or the photosensitive composition according to the first aspect, in which the polysiloxane obtained by protecting the silanol groups with acetal groups is a polysiloxane having a partial structure of Formula (2):

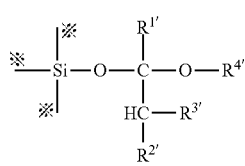

Formula (2)

(in Formula (2), $R^{1'}$, $R^{2'}$ and $R^{3'}$ each are a hydrogen atom or a $C_{1-10}$ alkyl group; $R^{4'}$ is a $C_{1-10}$ alkyl group; $R^{2'}$ and $R^{4'}$ optionally form a ring by bonding to each other; and a mark "*" indicates a bond to an adjacent atom).

As a seventh aspect, the present invention includes the coating composition or the photosensitive composition according to the first aspect, in which acetal protection of the silanol groups is carried out using a vinyl ether of Formula (3):

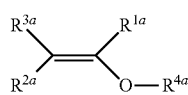

Formula (3)

(in Formula (3), $R^{1a}$, $R^{2a}$, and $R^{3a}$ each are a hydrogen atom or a $C_{1-10}$ alkyl group; $R^{4a}$ is a $C_{1-10}$ alkyl group; and $R^{2a}$ and $R^{4a}$ optionally form a ring by bonding to each other).

As an eighth aspect, the present invention includes the coating composition or the photosensitive composition according to the seventh aspect, in which the vinyl ether of Formula (3) is ethyl vinyl ether, propyl vinyl ether, butyl vinyl ether, ethylhexyl vinyl ether, cyclohexyl vinyl ether, 3,4-dihydro-2H-pyran, or 2,3-dihydrofuran.

As a ninth aspect, the present invention includes the coating composition according to any one of the first aspect to the eighth aspect, further comprising a thermal acid generator or a photoacid generator, in which the coating composition is applied onto a resist pattern or onto an organic underlayer film to which the resist pattern is transferred.

As a tenth aspect, the present invention includes the coating composition according to any one of the first aspect to the ninth aspect, further comprising one or more compounds selected from the group consisting of water, an acid, a quencher, and a curing catalyst.

As an eleventh aspect, the present invention includes a resist composition formed by further comprising a photoacid generator in the coating composition according to any one of the first aspect to the eighth aspect.

As a twelfth aspect, the present invention includes a method for producing a semiconductor device, the method comprising the steps of: (I) forming a pattern on a semiconductor substrate by a nano-imprinting method; (II) applying the coating composition according to any one of the first aspect to the tenth aspect onto the pattern to embed the polysiloxane; (III) curing the embedded polysiloxane and then etching or ashing the pattern formed by the nano-imprinting method to reverse the pattern; and (IV) processing the substrate using the polysiloxane film.

As a thirteenth aspect, the present invention includes a method for producing a semiconductor device, the method comprising the steps of: (A) forming a resist film on a semiconductor substrate; (B) exposing the resist film and developing the resist after the exposure to obtain a resist pattern; (C) applying the coating composition according to any one of the first aspect to the tenth aspect onto the patterned resist film to embed the polysiloxane; (D) curing the embedded polysiloxane and then etching or ashing the resist film to reverse the pattern; and (E) processing the substrate using the polysiloxane film.

As a fourteenth aspect, the present invention includes a method for producing a semiconductor device, the method comprising the steps of: (a) forming an organic underlayer film on a semiconductor substrate; (b) applying a silicon hard mask forming composition onto the organic underlayer film and baking the applied silicon hard mask forming composition to form a silicon hard mask; (c) applying a composition for a resist onto the silicon hard mask to form a resist layer; (d) exposing the resist film and developing the resist after the exposure to obtain a resist pattern; (e) applying the coating composition according to any one of the first aspect to the tenth aspect onto the resist pattern to embed the polysiloxane; (f) curing the embedded polysiloxane and then etching or ashing the resist film to reverse the pattern; (g) etching the silicon hard mask using the reversed pattern; (h) etching the organic underlayer film using the pattered silicon hard mask to form a patterned organic underlayer film; and (i) processing the substrate using the patterned organic underlayer film.

As a fifteenth aspect, the present invention includes a method for producing a semiconductor device, the method comprising the steps of: (1) forming an organic underlayer film on a semiconductor substrate; (2) applying a silicon hard mask forming composition onto the organic underlayer film and baking the applied silicon hard mask forming composition to form a silicon hard mask; (3) applying a composition for a resist onto the silicon hard mask to form a resist layer; (4) exposing the resist film and developing the resist after the exposure to obtain a resist pattern; (5) etching the silicon hard mask using the resist pattern; (6) etching the organic underlayer film using the pattered silicon hard mask to form a patterned organic underlayer film; (7) applying the coating composition according to any one of the first aspect to the tenth aspect onto the patterned organic underlayer film to embed the polysiloxane; (8) curing the embedded polysiloxane and then etching or ashing the organic underlayer film to reverse the pattern; and (9) processing the substrate using the polysiloxane film.

As a sixteenth aspect, the present invention includes a method for producing a semiconductor device, the method comprising the steps of: (i) forming a resist film on a semiconductor substrate using the resist composition according to the eleventh aspect; (ii) exposing the resist film and developing the resist after the exposure to obtain a resist pattern; and (iii) processing the substrate using the patterned resist film.

Effects of the Invention

In the present invention, the coating composition including the polysiloxane can be applied onto a resist pattern or a patterned organic underlayer film to which the resist pattern is transferred to embed (to fill) the coating composition between the spaces in the resist pattern or between the spaces in the pattern of the organic underlayer film without intermixing of the coating composition with the resist pattern formed on the substrate to be processed or the patterned organic underlayer film to which the resist pattern is transferred.

The coating composition including the polysiloxane is cured to form a polysiloxane and a smooth surface can be formed later by etch back using etching (gas etching). In addition, the organic underlayer film can be removed by ashing (ashing process) and thus the pattern formed in the resist or the organic underlayer film can be reversed to a pattern of the polysiloxane formed by filling the coating composition including polysiloxane. The substrate to be processed can be processed by these reversed patterns.

In the case where adhesiveness between the target substrate to be processed and the film with which the substrate is coated is more improved by the film made of the coating composition including polysiloxane than by the organic underlayer film, the substrate to be processed can be processed with the film having high adhesiveness by using such pattern reversal.

In the present invention, the polysiloxane includes the acetal-protected silanol groups. The acetal groups are eliminated by the acid generated from the acid generator to generate silanol groups and crosslinking is generated due to these generated silanol groups. Protection of the silanol groups with acetal groups allows silicon to be stably included in high concentration as the composition.

The polysiloxane can be included as the coating composition with which the resist pattern or the organic underlayer film having a pattern to which the resist pattern is transferred is coated and the photosensitive composition by utilizing such properties and thus the coating composition and the photosensitive composition have excellent properties.

MODES FOR CARRYING OUT THE INVENTION

The present invention includes the coating composition or the photosensitive composition comprising: a polysiloxane obtained from a hydrolysis-condensation product of a hydrolyzable silane having 2 to 4 hydrolyzable groups in a molecule by protecting silanol groups of the condensation product with acetal groups, in which, in the hydrolysis-condensation product, an organic group bonded to silicon atoms through Si—C bonds exists in a molar ratio of 0≤(the organic group)/(Si)≤0.29 on average.

The hydrolysis-condensation product is formed by hydrolyzing the hydrolyzable silane and condensing the resultant hydrolyzed product and is a polysiloxane.

In the hydrolysis-condensation product, the organic group bonded to silicon atoms through Si—C bonds exists in a molar ratio of 0≤(the organic group)/(Si)≤0.29 on an average and the organic group is bonded to the silicon atoms in a molar ratio of 0.29 or lower. That is, the hydrolysis-condensation product has a molar ratio of 0≤(the organic group)/(Si)≤0.29.

As the hydrolyzable silane, a hydrolyzable silane including the hydrolyzable silane of Formula (1) may be used.

In Formula (1), $R^1$ is an alkyl group, an aryl group, a halogenated alkyl group, a halogenated aryl group, an alkoxyaryl group, an alkenyl group, an organic group having an epoxy group, an acryloyl group, a methacryloyl group, a mercapto group, or a cyano group and is bonded to a silicon atom through a Si—C bond; $R^2$ is an alkoxy group, an acyloxy group, or a halogen group; and a is an integer of 0 to 3.

The hydrolyzable silane may include a hydrolyzable silane in which a is 0 in Formula (1) in a ratio of 71 mol % to 100 mol % and a hydrolyzable silane in which a is 1 in Formula (1) in a ratio of 0 mol % to 29 mol %.

The hydrolyzable silane may include a hydrolyzable silane in which a is 0 in Formula (1) in a ratio of 85.5 mol % to 100 mol % and a hydrolyzable silane in which a is 2 in Formula (1) in a ratio of 0 mol % to 14.5 mol %.

The composition including the polysiloxane according to the present invention includes the hydrolysis-condensation product of the hydrolyzable silane of Formula (1) and a solvent. As optional components, an acid, water, an alcohol, a curing catalyst, an acid generator, other organic polymers, a light absorbing compound, a surfactant, or the like may be included.

The solid content in the composition including the polysiloxane according to the present invention is, for example, 0.1% by mass to 50% by mass, 0.1% by mass to 30% by mass, or 0.1% by mass to 25% by mass. Here, the solid content is a content in which a solvent component is removed from the total components of the composition including the polysiloxane.

The ratio of hydrolyzable silane, the hydrolysis product thereof, and the hydrolysis-condensation product thereof included in the solid content is 20% by mass or higher, for example, 50% by mass to 100% by mass, 60% by mass to 99% by mass, or 70% by mass to 99% by mass.

The hydrolyzable silane, the hydrolysis product thereof, and the hydrolysis-condensation product thereof may also be used as a mixture of these compounds. The condensation product that is made by hydrolyzing the hydrolyzable silane and condensing the obtained hydrolysis product may be used. A partial hydrolysis product in which hydrolysis is not fully completed when the hydrolysis-condensation product is obtained and the silane compound may be mixed with the hydrolysis-condensation product and the resultant mixture may also be used. The condensation product is a polymer having a polysiloxane structure.

The alkyl group is a linear or branched alkyl group having a carbon atom number of 1 to 10 and examples thereof may include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

A cyclic alkyl group may be also used and examples of a $C_{1-10}$ cyclic alkyl group may include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The alkenyl group is a $C_{2-10}$ alkenyl group and examples thereof may include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butyl-ethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The aryl group includes a $C_{6-40}$ aryl group and examples thereof may include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the organic group having an epoxy group may include glycidoxymethyl, glycidoxyethyl, glycidoxypropyl, glycidoxybutyl, and epoxycyclohexyl.

Examples of the organic group having an acryloyl group may include acryloylmethyl, acryloylethyl, and acryloylpropyl.

Examples of the organic group having a methacryloyl group may include methacryloylmethyl, methacryloylethyl, and methacryloylpropyl.

Examples of the organic group having a mercapto group may include ethylmercapto, butylmercapto, hexylmercapto, and octylmercapto.

Examples of the organic group having a cyano group may include cyanoethyl and cyanopropyl.

Examples of a $C_{1-20}$ alkoxy group may include an alkoxy group containing linear, branched, or cyclic alkyl part having carbon atom number of 1 to 20. Examples of the alkoxy group containing the linear and branched alkyl part may include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the alkoxy group containing the cyclic alkyl part may include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the $C_{2-20}$ acyloxy group may include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen group may include fluorine, chlorine, bromine, and iodine.

The hydrolyzable silane of Formula (1) comprises any of a tetraalkoxysilane in which a is 0 in Formula (1), a methyltrialkoxysilane, a vinyltrialkoxysilane, or a phenyltrialkoxysilane in which a is 1 in Formula (1), or dimethyldialkoxysilane in which a is 2 in Formula (1).

The polysiloxane obtained from the hydrolysis-condensation product of the hydrolyzable silane by protecting the silanol groups of the condensation product with acetal groups may be used.

The polysiloxane obtained by protecting the silanol groups with acetal groups is a polysiloxane having a partial structure of Formula (2).

In Formula (2), $R^{1'}$, $R^{2'}$, and $R^{3'}$ each are a hydrogen atom or a $C_{1-10}$ alkyl group; $R^{4'}$ is a $C_{1-10}$ alkyl group; and $R^{2'}$ and $R^{4'}$ optionally form a ring by bonding to each other. In Formula (2), the mark "*" indicates a bond to an adjacent atom. Examples of the adjacent atom may include the oxygen atom of the siloxane bond, the oxygen atom of the silanol group, and the carbon atom originated from $R^{1'}$ of Formula (1). The alkyl group may be exemplified by the above examples.

The acetal-protection of the silanol groups may be carried out using the vinyl ether of Formula (3).

The hydrolysis-condensation product (polysiloxane) having the partial structure of Formula (2) is obtained by reacting the silanol group of the hydrolysis-condensation product of the hydrolyzable silane with the vinyl ether compound of Formula (3).

In Formula (3), $R^{1a}$, $R^{2a}$, and $R^{3a}$ each are a hydrogen atom or a $C_{1-10}$ alkyl group; $R^{4a}$ is a $C_{1-10}$ alkyl group; and $R^{2a}$ and $R^{4a}$ optionally form a ring by bonding to each other. The alkyl group may be exemplified by the above examples.

In the reaction conditions of the acetal protection, aprotic solvents such as propylene glycol monomethyl ether acetate, ethyl acetate, dimethylformamide, tetrahydrofuran, and 1,4-dioxane may be used as the solvent. As the catalyst, pyridinium para-toluenesulfonate, trifluoromethanesulfonic acid, para-toluenesulfonic acid, methanesulfonic acid, hydrochloric acid, sulfuric acid, or the like may be used. Weak acids such as pyridium para-toluenesulfonate are particularly preferable.

Examples of the vinyl ether of Formula (3) may include aliphatic vinyl ether compounds such as methyl vinyl ether, ethyl vinyl ether, isopropyl vinyl ether, normal-butyl vinyl ether, 2-ethylhexyl vinyl ether, tert-butyl vinyl ether, and cyclohexyl vinyl ether and cyclic vinyl ether compounds such as 2,3-dihydrofuran, 4-methyl-2,3-dihydrofuran, and 2,3-dihydro-4H-pyran. In particular, ethyl vinyl ether, propyl vinyl ether, butyl vinyl ether, ethylhexyl vinyl ether, cyclohexyl vinyl ether, 3,4-dihydro-2H-pyran, or 2,3-dihydrofuran can be preferably used.

In the present invention, the silanol groups in the hydrolysis-condensation product of the hydrolyzable silane can be protected with acetal groups at any ratio. In the obtained polysiloxane, the silanol groups and the silanol groups protected with acetal groups can exist in a ratio of (acetal group)/(acetal group+silanol group) of 1 mol % to 100 mol % or 5 mol % to 85 mol %.

Specific examples of the hydrolysis-condensation product (polysiloxane) used in the present invention may include the following compounds.

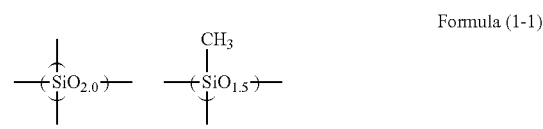

Formula (1-1)

Formula (1-2)

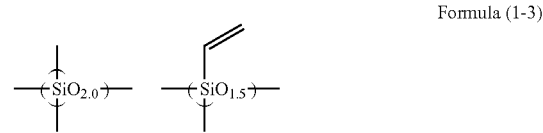

Formula (1-3)

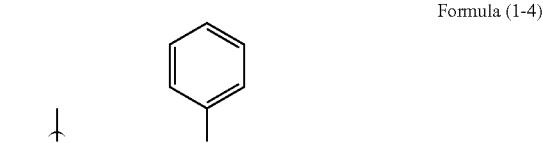

Formula (1-4)

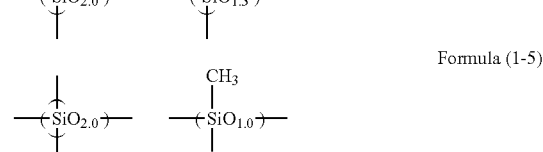

Formula (1-5)

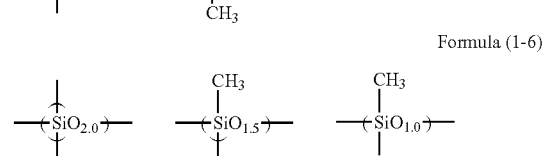

Formula (1-6)

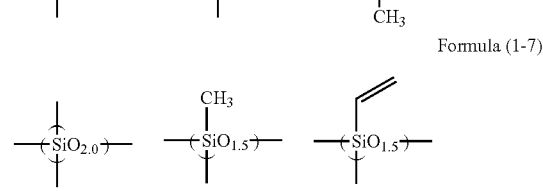

Formula (1-7)

Formula (1-8)

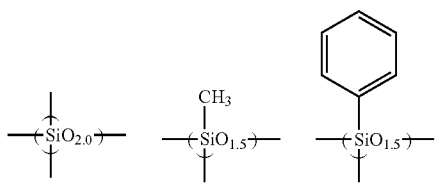

As the hydrolysis-condensation product (polyorganosiloxane) of the hydrolyzable silane, a condensation product having a weight average molecular weight of 1,000 to 1,000,000 or 1,000 to 100,000 can be obtained. These molecular weights are molecular weights determined by GPC analysis in terms of polystyrene.

For example, measurement conditions of GPC are as follows: GPC apparatus (trade name HLC-8220GPC, manufactured by Tosoh Co., Ltd), GPC column (trade name Shodex KF803L, KF802, and KF801, manufactured by Showa Denko K.K.), Column temperature at 40° C., eluent (elution solvent) of tetrahydrofuran, and flow volume (flow rate) at 1.0 ml/min. The measurement can be carried out using polystyrene (manufactured by Showa Denko K.K.) as a standard sample.

For hydrolysis of an alkoxysilyl group, an acyloxysilyl group, or a halogenated silyl group, 0.5 mole to 100 moles, preferably 1 mole to 10 moles of water per 1 mole of the hydrolyzable group is used.

The hydrolysis catalyst may be used in an amount of 0.001 mole to 10 moles and preferably 0.001 mole to 1 mole per 1 mole of the hydrolyzable group.

The reaction temperature during the hydrolysis and condensation is usually 20° C. to 80° C.

The hydrolysis may be complete hydrolysis or may be partial hydrolysis. In other words, the hydrolysis product and the monomer may remain in the hydrolysis-condensation product. The catalyst may be used during the hydrolysis and condensation.

An acid or a base may be used as the hydrolysis catalyst.

Examples of the hydrolysis catalyst may include a metal chelate compound, an organic acid, an inorganic acid, an organic base, and an inorganic base. Examples of the metal chelate compound as the hydrolysis catalyst may include titanium chelate compounds such as triethoxy-mono(acetylacetonate) titanium, tri-n-propoxy-mono(acetylacetonate) titanium, tri-i-propoxy-mono(acetylacetonate) titanium, tri-n-butoxy-mono(acetylacetonate) titanium, tri-sec-butoxy-mono(acetylacetonate) titanium, tri-t-butoxy-mono(acetylacetonate) titanium, diethoxy-bis(acetylacetonate) titanium, di-n-propoxy-bis(acetylacetonate) titanium, di-i-propoxy-bis(acetylacetonate) titanium, di-n-butoxy-bis(acetylacetonate) titanium, di-sec-butoxy-bis(acetylacetonate) titanium, di-t-butoxy-bis(acetylacetonate) titanium, monoethoxy-tris(acetylacetonate) titanium, mono-n-propoxy-tris(acetylacetonate) titanium, mono-i-propoxy-tris(acetylacetonate) titanium, mono-n-butoxy-tris(acetylacetonate) titanium, mono-sec-butoxy-tris(acetylacetonate) titanium, mono-t-butoxy-tris(acetylacetonate) titanium, tetrakis(acetylacetonate) titanium, triethoxy-mono(ethyl acetoacetate) titanium, tri-n-propoxy-mono(ethyl acetoacetate) titanium, tri-i-propoxy-mono(ethyl acetoacetate) titanium, tri-n-butoxy-mono(ethyl acetoacetate) titanium, tri-sec-butoxy-mono(ethyl acetoacetate) titanium, tri-t-butoxy-mono(ethyl acetoacetate) titanium, diethoxy-bis(ethyl acetoacetate) titanium, di-n-propoxy-bis(ethyl acetoacetate) titanium, di-i-propoxy-bis(ethyl acetoacetate) titanium, di-n-butoxy-bis(ethyl acetoacetate) titanium, di-sec-butoxy-bis(ethyl acetoacetate) titanium, di-t-butoxy-bis(ethyl acetoacetate) titanium, monoethoxy-tris(ethyl acetoacetate) titanium, mono-n-propoxy-tris(ethyl acetoacetate) titanium, mono-i-propoxy-tris(ethyl acetoacetate) titanium, mono-n-butoxy-tris(ethyl acetoacetate) titanium, mono-sec-butoxy-tris(ethyl acetoacetate) titanium, mono-t-butoxy-tris(ethyl acetoacetate) titanium, tetrakis(ethyl acetoacetate) titanium, mono(acetylacetonate)-tris(ethyl acetoacetate) titanium, bis(acetylacetonate)-bis(ethyl acetoacetate) titanium, and tris(acetylacetonate)-mono(ethyl acetoacetate) titanium; zirconium chelate compounds such as triethoxy-mono(acetylacetonate) zirconium, tri-n-propoxy-mono(acetylacetonate) zirconium, tri-i-propoxy-mono(acetylacetonate) zirconium, tri-n-butoxy-mono(acetylacetonate) zirconium, tri-sec-butoxy-mono(acetylacetonate) zirconium, tri-t-butoxy-mono(acetylacetonate) zirconium, diethoxy-bis(acetylacetonate) zirconium, di-n-propoxy-bis(acetylacetonate) zirconium, di-i-propoxy-bis(acetylacetonate) zirconium, di-n-butoxy-bis(acetylacetonate) zirconium, di-sec-butoxy-bis(acetylacetonate) zirconium, di-t-butoxy-bis(acetylacetonate) zirconium, monoethoxy-tris(acetylacetonate) zirconium, mono-n-propoxy-tris(acetylacetonate) zirconium, mono-i-propoxy-tris(acetylacetonate) zirconium, mono-n-butoxy-tris(acetylacetonate) zirconium, mono-sec-butoxy-tris(acetylacetonate) zirconium, mono-t-butoxy-tris(acetylacetonate) zirconium, tetrakis(acetylacetonate) zirconium, triethoxy-mono(ethyl acetoacetate) zirconium, tri-n-propoxy-mono(ethyl acetoacetate) zirconium, tri-i-propoxy-mono(ethyl acetoacetate) zirconium, tri-n-butoxy-mono(ethyl acetoacetate) zirconium, tri-sec-butoxy-mono(ethyl acetoacetate) zirconium, tri-t-butoxy-mono(ethyl acetoacetate) zirconium, diethoxy-bis(ethyl acetoacetate) zirconium, di-n-propoxy-bis(ethyl acetoacetate) zirconium, di-i-propoxy-bis(ethyl acetoacetate) zirconium, di-n-butoxy-bis(ethyl acetoacetate) zirconium, di-sec-butoxy-bis(ethyl acetoacetate) zirconium, di-t-butoxy-bis(ethyl acetoacetate) zirconium, monoethoxy-tris(ethyl acetoacetate) zirconium, mono-n-propoxy-tris(ethyl acetoacetate) zirconium, mono-i-propoxy-tris(ethyl acetoacetate) zirconium, mono-n-butoxy-tris(ethyl acetoacetate) zirconium, mono-sec-butoxy-tris(ethyl acetoacetate) zirconium, mono-t-butoxy-tris(ethyl acetoacetate) zirconium, tetrakis(ethyl acetoacetate) zirconium, mono(acetylacetonate)-tris(ethyl acetoacetate) zirconium, bis(acetylacetonate)-bis(ethyl acetoacetate) zirconium, and tris(acetylacetonate)-mono (ethyl acetoacetate) zirconium, and aluminum chelate compounds such as tris(acetylacetonate) aluminum and tris(ethyl acetoacetate) aluminum.

Examples of the organic acid as the hydrolysis catalyst may include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst may include hydrochloric acid, nitric acid, sulfuric acid, hydrofluoric acid, and phosphoric acid.

Examples of the organic base as the hydrolysis catalyst may include pyridine, pyrrole, piperazine, pyrrolidine, piperidine, picoline, trimethylamine, triethylamine, monoethanolamine, diethanolamine, dimethyl-monoethanolamine, monomethyl-diethanolamine, triethanolamine, diazabicyclooctane, diazabicyclononane, diazabicycloundecene, and tetramethylammonium hydroxide. Examples of the inorganic base may include ammonia, sodium hydroxide, potassium hydroxide, barium hydroxide, and calcium hydroxide. Of these catalysts, the metal chelate compound, the organic acid, and the inorganic acid are preferable, and these catalysts may be used singly or in combination of two or more of them.

Examples of the organic solvent used for the hydrolysis may include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents such as methanol, ethanol, n-propanol, i-propanol, n-butanol, i-butanol, sec-butanol, t-butanol, n-pentanol, i-pentanol, 2-methyl-butanol, sec-pentanol, t-pentanol, 3-methoxy butanol, n-hexanol, 2-methylpentanol, sec-hexanol, 2-ethyl butanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethyl cyclohexanol, benzyl alcohol, phenyl methyl carbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyl-dioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methxoybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol di-acetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents may be used singly or in combination of two or more of them.

In particular, the following ketone solvents are preferable from the viewpoint of storage stability of the obtained solution: acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone, and fenchone.

The coating composition including the polysiloxane according to the present invention may include a curing catalyst. The curing catalyst acts as a curing catalyst when a coating film containing a polyorganosiloxane made of the hydrolysis-condensation product is heated and cured.

Examples of the curing catalyst may include ammonium salts, phosphines, phosphonium salts, and sulfonium salts.

Examples of the ammonium salt may include a quaternary ammonium salt having a structure of Formula (D-1):

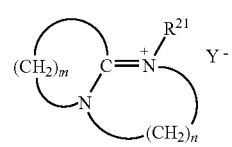

Formula (D-1)

(wherein m is an integer of 2 to 11; n is an integer of 2 or 3; $R^{21}$ is an alkyl group or an aryl group; and $Y^-$ is an anion), a quaternary ammonium salt having a structure of (D-2):

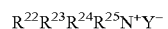

Formula (D-2)

(wherein $R^{22}$, $R^{23}$, $R^{24}$, and $R^{25}$ are alkyl groups or aryl groups; N is a nitrogen atom; $Y^-$ is an anion; and $R^{22}$, $R^{23}$, $R^{24}$, and $R^{25}$ each are bonded to the nitrogen atom through a C—N bond), a quaternary ammonium salt having a structure of Formula (D-3):

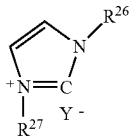

Formula (D-3)

(wherein $R^{26}$ and $R^{27}$ are alkyl groups or aryl groups, and $Y^-$ is an anion), a quaternary ammonium salt having a structure of Formula (D-4):

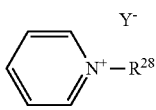

Formula (D-4)

(wherein $R^{28}$ is an alkyl group or an aryl group, and $Y^-$ is an anion), a quaternary ammonium salt having a structure of Formula (D-5):

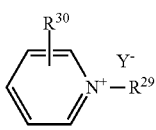

Formula (D-5)

(wherein $R^{29}$ and $R^{30}$ are alkyl groups or aryl groups, and $Y^-$ is an anion), and a tertiary ammonium salt having a structure of Formula (D-6):

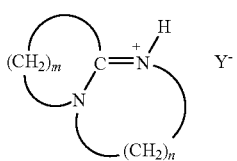

Formula (D-6)

(wherein m is an integer of 2 to 11; n is an integer of 2 or 3; H is a hydrogen atom; and $Y^-$ is an anion).

Examples of the phosphonium salts may include a quaternary phosphonium salt of Formula (D-7):

$R^{31}R^{32}R^{33}R^{34}P^+Y^-$  Formula (D-7)

(wherein $R^{31}$, $R^{32}$, $R^{33}$, and $R^{34}$ are alkyl groups or aryl groups; P is a phosphorus atom; $Y^-$ is an anion, and $R^{31}$, $R^{32}$, $R^{33}$, and $R^{34}$ each are bonded to the phosphorus atom through a C—P bond).

Examples of the sulfonium salts may include a tertiary sulfonium salt of Formula (D-8):

$R^{35}R^{36}R^{37}S^+Y^-$  Formula (D-8)

(wherein $R^{35}$, $R^{36}$, and $R^{37}$ are alkyl groups or aryl groups; S is a sulfur atom; $Y^-$ is an anion, and $R^{35}$, $R^{36}$, and $R^{37}$ each are bonded to the sulfur atom through a C—S bond).

The compound of Formula (D-1) is a quaternary ammonium salt derived from an amine. m is an integer of 2 to 11 and n is an integer of 2 or 3. $R^{21}$ in the quaternary ammonium salt is a $C_{1-18}$ alkyl group or aryl group and preferably $C_{2-10}$ alkyl group or aryl group. Examples of $R^{21}$ may include linear alkyl groups such as ethyl group, propyl group, and butyl group, and benzyl group, cyclohexyl group, cyclohexylmethyl group, and di-cyclopentadienyl group. Examples of the anion ($Y^-$) may include halogen ions such as a chlorine ion ($Cl^-$), a bromide ion ($Br^-$), and an iodide ion ($I^-$), and acid groups such as carboxylate (—COO$^-$), sulfonate (—SO$_3^-$), and alcoholate (—O$^-$).

The compound of Formula (D-2) is a quaternary ammonium salt of $R^{22}R^{23}R^{24}R^{25}N^+Y^-$. $R^{22}$, $R^{23}$, $R^{24}$, and $R^{25}$ in the quaternary ammonium salt are a $C_{1-18}$ alkyl group or aryl group or a silane compound bonding to a silicon atom through a Si—C bond. Examples of the anion ($Y^-$) may include halogen ions such as a chlorine ion ($Cl^-$), a bromide ion ($Br^-$), and an iodide ion ($I^-$), and acid groups such as carboxylate (—COO$^-$), sulfonate (—SO$_3^-$), and alcoholate (—O$^-$). The quaternary ammonium salt is commercially available and examples of the quaternary ammonium salt may include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. $R^{26}$ and $R^{27}$ each have a carbon number of 1 to 18 and the total carbon number of $R^{26}$ and $R^{27}$ is preferably 7 or more. Examples of $R^{26}$ may include methyl group, ethyl group, propyl group, phenyl group, and benzyl group and examples of $R^{27}$ may include benzyl group, octyl group, and octadecyl group. Examples of the anion ($Y^-$) may include halogen ions such as a chlorine ion ($Cl^-$), a bromide ion ($Br^-$), and an iodide ion ($I^-$), and acid groups such as carboxylate (—COO$^-$), sulfonate (—SO$_3^-$), and alcoholate (—O$^-$). The compound is commercially available or can be produced by reacting, for example, an imidazole-based compound such as 1-methylimidazole and 1-benzylimidazole with a halogenated alkyl or a halogenated aryl such as benzyl bromide and methyl bromide.

The compound of Formula (D-4) is a quaternary ammonium salt derived from pyridine. $R^{28}$ is a $C_{1-18}$ alkyl group or aryl group and preferably a $C_{4-18}$ alkyl group or aryl group. Examples of $R^{28}$ may include butyl group, octyl group, benzyl group, and lauryl group. Examples of the anion ($Y^-$) may include halogen ions such as a chlorine ion ($Cl^-$), a bromide ion ($Br^-$), and an iodide ion ($I^-$), and acid groups such as carboxylate (—COO$^-$), sulfonate (—SO$_3^-$), and alcoholate (—O$^-$). The compound is commercially available or can be produced by reacting, for example, pyridine with a halogenated alkyl or a halogenated aryl such as lauryl chloride, benzyl chloride, benzyl bromide, methyl bromide, and octyl bromide. Examples of the compound may include N-laurylpyridinium chloride and N-benzylpyridinium bromide.

The compound of Formula (D-5) is a quaternary ammonium salt derived from a substituted pyridine such as picoline and the like. $R^{29}$ is a $C_{1-18}$ alkyl group or aryl group and preferably a $C_{4-18}$ alkyl group or aryl group. Examples of $R^{29}$ may include methyl group, octyl group, lauryl group and benzyl group. $R^{30}$ is a $C_{1-18}$ alkyl group or aryl group and, for example, is methyl group in the case where the compound is a quaternary ammonium derived from picoline. Examples of the anion ($Y^-$) may include halogen ions such as a chlorine ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). The compound is commercially available or can be produced by reacting, for example, a substituted pyridine such as picoline with a halogenated alkyl or a halogenated aryl such as methyl bromide, octyl bromide, lauryl chloride, benzyl chloride, and benzyl bromide. Examples of the compound may include N-benzylpicolinium chloride, N-benzylpicolinium bromide, and N-laurylpicolinium chloride.

The compound of Formula (D-6) is a tertiary ammonium salt derived from an amine. m is an integer of 2 to 11 and n is an integer of 2 or 3. Examples of the anion (Y$^-$) may include halogen ions such as a chlorine ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). The compound can be produced by reacting an amine with a weak acid such as a carboxylic acid and phenol. Example of the carboxylic acid may include formic acid and acetic acid. In the case where formic acid is used, the anion (Y$^-$) is (HCOO$^-$), and in the case where acetic acid is used, the anion (Y$^-$) is (CH$_3$COO$^-$). In the case where phenol is used, the anion (Y$^-$) is (C$_6$H$_5$O$^-$).

The compound of Formula (D-7) is a quaternary phosphonium salt having a structure of R$^{31}$R$^{32}$R$^{33}$R$^{34}$P$^+$Y$^-$. R$^{31}$, R$^{32}$, R$^{33}$, and R$^{34}$ are C$_{1-18}$ alkyl groups or aryl groups or a silane compound bonding to a silicon atom through a Si—C bond. Preferably three substituents out of the four substituents of R$^{31}$ to R$^{34}$ are phenyl groups or substituted phenyl groups, and examples of the phenyl groups or substituted phenyl groups may include phenyl group and tolyl group. Remaining one substituent is a C$_{1-18}$ alkyl group or aryl group or a silane compound bonding to a silicon atom through a Si—C bond. Examples of the anion (Y$^-$) may include halogen ions such as a chlorine ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). The compound is commercially available and examples of the compound may include halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenyl-mono-alkylphosphoniums such as a halogenated triphenylmethylphosphonium and a halogenated triphenylethylphosphonium; a halogenated triphenylbenzylphosphonium, a halogenated tetraphenylphosphonium, a halogenated tritolyl-mono-arylphosphonium, or a halogenated tritolyl-mono-alkylphosphonium (the halogen atom is a chlorine atom or bromine atom). In particular, halogenated triphenyl-mono-alkylphosphoniums such as the halogenated triphenylmethylphosphonium and the halogenated triphenylethylphosphonium; halogenated triphenyl-mono-arylphosphoniums such as the halogenated triphenylbenzylphosphonium; halogenated tritolyl-mono-arylphosphoniums such as the halogenated tritolyl-mono-phenylphosphonium; and halogenated tritolyl-mono-alkylphosphoniums such as the halogenated tritolyl-mono-methylphosphonium (the halogen atom is a chlorine atom or bromine atom) are preferable.

Examples of the phosphines may include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (D-8) is a tertially sulfonium salts having a structure of R$^{35}$R$^{36}$R$^{37}$S$^+$Y$^-$. R$^{35}$, R$^{36}$, and R$^{37}$ are C$_{1-18}$ alkyl groups or aryl groups or a silane compound bonding to a silicon atom through a Si—C bond. Preferably, two substituents out of the three substituents of R$^{35}$ to R$^{37}$ are phenyl groups or substituted phenyl groups, and examples of phenyl groups or substituted phenyl groups may include phenyl group and tolyl group. Remaining one substituent is a C$_{1-18}$ alkyl group or aryl group. Examples of the anion (Y$^-$) may include halogen ions such as a chlorine ion (Cl$^-$), a bromide ion (Br$^-$), and an iodide ion (I$^-$), and acid groups such as carboxylate (—COO$^-$), sulfonate (—SO$_3^-$), alcoholate (—O$^-$), maleate anion, and nitrate anion. The compound is commercially available and examples of the compound may include halogenated tetraalkylsulfoniums such as a halogenated tri-n-butylsulfonium and a halogenated tri-n-propylsulfonium; halogenated trialkylbenzylsulfoniums such as a halogenated diethylbenzylsulfonium; halogenated diphenyl-mono-alkylsulfoniums such as a halogenated diphenylmethylsulfonium and a halogenated diphenylethylsulfonium; a halogenated triphenylsulfonium (the halogen atom is a chlorine atom or bromine atom), trialkylsulfonium carboxylates such as tri-n-butylsulfonium carboxylate and tri-n-propylsulfonium carboxylate; dialkylbenzylsulfonium carboxylates such as diethylbenzylsulfonium carboxylate; diphenyl-mono-alkylsulfonium carboxylates such as diphenylmethylsulfonium carboxylate and diphenylethylsulfonium carboxylate; and triphenylsulfonium carboxylate. The halogenated triphenylsulfonium and the triphenylsulfonium carboxylate can be preferably used.

In the present invention, a nitrogen-containing silane compound can be added as a curing catalyst. Examples of the nitrogen-containing silane compound may include imidazole ring-containing silane compounds such as N-(3-triethoxysilypropyl)-4,5-dihydroimidazole.

The amount of the curing catalyst is 0.01 part by mass to 10 parts by mass, 0.01 part by mass to 5 parts by mass, or 0.01 part by mass to 3 parts by mass relative to 100 parts by mass of the polyorganosiloxane.

The hydrolyzable silane can be hydrolyzed and condensed in the solvent using the catalyst. Alcohols as by-products, the used hydrolysis catalyst, and water can be simultaneously removed from the obtained hydrolysis-condensation product (a polymer) by distillation under reduced pressure or other operations. The acid catalyst and the basic catalyst used for the hydrolysis can be removed by neutralization or ion exchange. To the coating composition including the polysiloxane according to the present invention, an organic acid, water, an alcohol, or a combination thereof can be added in order to stabilize the coating composition including the hydrolysis-condensation product (polysiloxane).

Examples of the organic acid may include oxalic acid, malonic acid, methylmalonic acid, succinic acid, maleic acid, malic acid, tartaric acid, phthalic acid, citric acid, glutaric acid, lactic acid, and salicylic acid. Of these organic acids, oxalic acid and maleic acid are preferable. The amount of the organic acid to be added is 0.1 part by mass to 5.0 parts by mass relative to 100 parts by mass of the condensation product (polyorganosiloxane). As water to be added, pure water, ultrapure water, ion-exchanged water, and the like may be used. An amount of the water to be added may be 1 part by mass to 20 parts by mass relative to 100 parts of the coating composition including the polysiloxane.

As the alcohol to be added, an alcohol that is easy to be evaporated by heating after application is preferable. Examples of the alcohol may include methanol, ethanol, propanol, isopropanol (2-propanol), and butanol. The amount of the alcohol to be added may be 1 part by mass to 20 parts by mass relative to 100 parts by mass of the coating composition including the polysiloxane.

The coating composition including the polysiloxane may include one or more compounds selected from the group consisting of water, the acid, the quencher, and the curing catalyst.

In addition to the above components, the coating composition including the polysiloxane according to the present invention may include, for example, an organic polymer compound, a photoacid generator, and a surfactant, if necessary.

Use of the organic polymer compound allows a dry etching rate (a decreased amount in a film thickness per unit time), an attenuation coefficient, and a refractive index of the resist underlayer film formed from the coating composition including the polysiloxane according to the present invention to be controlled.

The composition includes a compound that generates an acid in response to actinic rays or radiation rays (photoacid generator) when the present invention is used for the coating composition, in particular, a radiation sensitive composition (resist composition). As the component of the photoacid generator, any compound may be used as long as the compound generates an acid by irradiation with high energy rays.

Examples of the suitable photoacid generators may include sulfonium salts, iodonium salts, sulfonyldiazomethane, N-sulfonyloxyimide, and oxime-O-sulfonate type acid generators. As will be described in detail below, these compounds may be used singly or in combination of two or more of the compounds.

The sulfonium salt is a salt of a sulfonium cation and a sulfonate, bis(substituted alkylsulfonyl)imide, or tris(substituted alkylsulfonyl)methide.

Examples of the sulfonium cation may include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl) sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl) sulfonium, tris(4-dimethylaminophenyl) sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Examples of the sulfonate may include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodeca-3-en-8-yl)ethanesulfonate.

Examples of the bis(substituted alkylsulfonyl) imide may include bistrifluoromethylsulfonylimide, bispentafluoroethylsulfonylimide, bisheptafluoropropylsulfonylimide, and 1,3-propylenebissulfonylimide. Examples of tris(substituted alkylsulfonyl)methide may include tristrifluoromethylsulfonylmethide. The sulfonium salts may include sulfonium salts made by combining these groups.

The iodonium salt is a salt made of an iodonium cation and a sulfonate, bis(substituted alkylsulfonyl)imide, or tris(substituted alkylsulfonyl)methide.

Examples of the iodonium cation may include aryliodonium cations such as diphenyliodonium, bis(4-tert-butylphenyl)iodonium, 4-tert-butoxyphenylphenyliodonium, and 4-methoxyphenylphenyliodonium. The above are presented as examples of the sulfonate, the bis(substituted alkylsulfonyl)imide, or the tris(substituted alkylsulfonyl)methide. The iodonium salts may include iodonium salts made by combining these groups.

Examples of the sulfonyldiazomethane may include bis-sulfonyldiazomethanes and sulfonyl-carbonyldiazomethanes such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-n-hexyloxy phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Examples of the N-sulfonyloxyimide type photoacid generator may include a combination of an imide skeleton such as succinimide, naphthalenedicarboxylic acid imide, phthalic acid imide, cyclohexyldicarboxylic acid imide, 5-norbornene-2,3-dicarboxylic acid imide, and 7-oxabicyclo[2.2.1]-5-heptene-2,3-dicarboxylic acid imide and a sulfonate.

Examples of the sulfonate may include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodeca-3-en-8-yl)ethanesulfonate, and a combination thereof.

Examples of the benzoin sulfonate type photoacid generator may include benzoin tosylate, benzoin mesylate, and benzoin butanesulfonate.

Examples of the pyrogallol trisulfonate type photoacid generator may include compounds in which all the hydroxy groups in pyrogallol, phlorogricinol, catechol, resorcinol, or hydroquinone are substituted with the following groups. Examples of the substituent may include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodeca-3-en-8-yl)ethanesulfonate.

Examples of the pyrogallol trisulfonate type photoacid generator may include compounds substituted with these substituents.

Examples of the sulfone type photoacid generators may include bis(phenylsulfonyl) methane, bis(4-methylphenylsulfonyl)methane, bis(2-naphthylsulfonyl)methane, 2,2-bis(phenylsulfonyl)propane, 2,2-bis (4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Examples of the glyoxime derivative type photoacid generators may include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-1,2-cyclohexanedione dioxime, bis-O-(2,2,2-trifluoroethanesulfonyl)-1,2-cyclohexanedione dioxime, bis-O-(10-camphorsulfonyl)-1,2-cyclohexanedione dioxime, bis-O-(benzenesulfonyl)-1,2-cyclohexanedione dioxime, bis-O-(p-fluorobenzenesulfonyl)-1,2-cyclohexanedione dioxime, bis-O-(p-trifluoromethylbenzenesulfonyl)-1,2-cyclohexanedione dioxime, and bis-O-(xylenesulfonyl)-1,2-cyclohexanedione dioxime.

Examples of oxime sulfonates may include, in particular, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, and (5-n-octanesulfonyloxyimino-5H-thiophen-2-ylidene)(2-methylphenyl)acetonitrile and may further include (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phen ylacetonitrile.

Examples of oxime sulfonates may include, in particular, 2,2,2-trifluoro-1-phenyl-ethanoneoxime-O-methylsulfonate, 2,2,2-trifluoro-1-phenyl-ethanoneoxime-O-(10-camphorylsulfonate), 2,2,2-trifluoro-1-phenyl-ethanoneoxime-O-(4-methoxyphenylsulfonate), 2,2,2-trifluoro-1-phenyl-ethanoneoxime-O-(1-naphthylsulfonate), 2,2,2-trifluoro-1-phenyl-ethanoneoxime-O-(2-naphthylsulfonate), 2,2,2-trifluoro-1-phenyl-ethanoneoxime-O-(2,4,6-trimethylphenylsulfonate), 2,2,2-trifluoro-1-(4-methylphenyl)-ethanoneoxime-O-(10-camphorylsulfonate), 2,2,2-trifluoro-1-(4-methylphenyl)-ethanoneoxime-O-(methylsulfonate), 2,2,2-trifluoro-1-(2-methylphenyl)-ethanoneoxime-O-(10-camphorylsulfonate), 2,2,2-trifluoro-1-(2,4-dimethylphenyl)-ethanoneoxime-O-(10-camphorylsulfonate), 2,2,2-trifluoro-1-(2,4-dimethylphenyl)-ethanoneoxime-O-(1-naphthylsulfonate), 2,2,2-trifluoro-1-(2,4-dimethylphenyl)-ethanoneoxime-O-(2-naphthylsulfonate), 2,2,2-trifluoro-1-

(2,4,6-trimethylphenyl)-ethanoneoxime-O-(10-camphorthylsulfonate), 2,2,2-trifluoro-1-(2,4,6-trimethylphenyl)-ethanoneoxime-O-(1-naphthylsulfonate), 2,2,2-trifluoro-1-(2,4,6-trimethylphenyl)-ethanoneoxime-O-(2-naphthylsulfonate), 2,2,2-trifluoro-1-(4-methoxyphenyl)-ethanoneoxime-O-methylsulfonate, 2,2,2-trifluoro-1-(4-methylthiophenyl)-ethanoneoxime-O-methylsulfonate, 2,2,2-trifluoro-1-(3,4-dimethoxyphenyl)-ethanoneoxime-O-methylsulfonate, 2,2,3,3,4,4,4-heptafluoro-1-phenyl-butanoneoxime-O-(10-camphorylsulfonate), 2,2,2-trifluoro-1-(phenyl)-ethanoneoxime-O-methylsulfonate, 2,2,2-trifluoro-1-(phenyl)-ethanoneoxime-O-10-camphorylsulfonate, 2,2,2-trifluoro-1-(phenyl)-ethanoneoxime-O-(4-methoxyphenyl)sulfonate, 2,2,2-trifluoro-1-(phenyl)-ethanoneoxime-O-(1-naphthyl)sulfonate, 2,2,2-trifluoro-1-(phenyl)-ethanoneoxime-O-(2-naphthyl)sulfonate, 2,2,2-trifluoro-1-(phenyl)-ethanoneoxime-O-(2,4,6-trimethylphenyl)sulfonate, 2,2,2-trifluoro-1-(4-methylphenyl)-ethanoneoxime-O-(10-camphoryl)sulfonate, 2,2,2-trifluoro-1-(4-methylphenyl)-ethanoneoxime-O-methylsulfonate, 2,2,2-trifluoro-1-(2-methylphenyl)-ethanoneoxime-O-(10-camphoryl)sulfonate, 2,2,2-trifluoro-1-(2,4-dimethylphenyl)-ethanoneoxime-O-(1-naphthyl)sulfonate, 2,2,2-trifluoro-1-(2,4-dimethylphenyl)-ethanoneoxime-O-(2-naphthyl)sulfonate, 2,2,2-trifluoro-1-(2,4,6-trimethylphenyl)-ethanoneoxime-O-(10-camphoryl)sulfonate, 2,2,2-trifluoro-1-(2,4,6-trimethylphenyl)-ethanoneoxime-O-(1-naphthyl)sulfonate, 2,2,2-trifluoro-1-(2,4,6-trimethylphenyl)-ethanoneoxime-O-(2-naphthyl)sulfonate, 2,2,2-trifluoro-1-(4-methoxyphenyl)-ethanoneoxime-O-methylsulfonate, 2,2,2-trifluoro-1-(4-thiomethylphenyl)-ethanoneoxime-O-methylsulfonate, 2,2,2-trifluoro-1-(3,4-dimethoxyphenyl)-ethanoneoxime-O-methylsulfonate, 2,2,2-trifluoro-1-(4-methoxyphenyl)-ethanoneoxime-O-(4-methylphenyl)sulfonate, 2,2,2-trifluoro-1-(4-methoxyphenyl)-ethanoneoxime-O-(4-methoxyphenyl)sulfonate, 2,2,2-trifluoro-1-(4-methoxyphenyl)-ethanoneoxime-O-(4-dodecylphenyl)sulfonate, 2,2,2-trifluoro-1-(4-methoxyphenyl)-ethanoneoxime-O-octylsulfonate, 2,2,2-trifluoro-1-(4-thiomethylphenyl)-ethanoneoxime-O-(4-methoxyphenyl)sulfonate, 2,2,2-trifluoro-1-(4-thiomethylphenyl)-ethanoneoxime-O-(4-dodecylphenyl)sulfonate, 2,2,2-trifluoro-1-(4-thiomethylphenyl)-ethanoneoxime-O-octylsulfonate, 2,2,2-trifluoro-1-(4-thiomethylphenyl)-ethanoneoxime-O-(2-naphthyl)sulfonate, 2,2,2-trifluoro-1-(2-methylphenyl)-ethanoneoxime-O-methylsulfonate, 2,2,2-trifluoro-1-(4-methylphenyl)-ethanoneoxime-O-phenylsulfonate, 2,2,2-trifluoro-1-(4-chlorophenyl)-ethanoneoxime-O-phenylsulfonate, 2,2,3,3,4,4,4-heptafluoro-1-(phenyl)-butanoneoxime-O-(10-camphoryl) sulfonate, 2,2,2-trifluoro-1-naphthyl-ethanoneoxime-O-methylsulfonate, 2,2,2-trifluoro-2-naphthyl-ethanoneoxime-O-methylsulfonate, 2,2,2-trifluoro-1-[4-benzylphenyl]-ethanoneoxime-O-methylsulfonate, 2,2,2-trifluoro-1-[4-(phenyl-1,4-dioxa-but-1-yl)phenyl]-ethanoneoxime-O-methylsulfonate, 2,2,2-trifluoro-1-naphthyl-ethanoneoxime-O-propylsulfonate, 2,2,2-trifluoro-2-naphthyl-ethanoneoxime-O-propylsulfonate, 2,2,2-trifluoro-1-[4-benzylphenyl]-ethanoneoxime-O-propylsulfonate, 2,2,2-trifluoro-1-[4-methylsulfonylphenyl]-ethanoneoxime-O-propylsulfonate, 1,3-bis[1-(4-phenoxyphenyl)-2,2,2-trifluoroethanoneoxime-O-sulfonyl]phenyl, 2,2,2-trifluoro-1-[4-methylsulfonyloxyphenyl]-ethanonoxime-O-propylsulfonate, 2,2,2-trifluoro-1-[4-methylcarbonyloxyphenyl]-ethanoneoxime-O-propylsulfonate, 2,2,2-trifluoro-1-[6H,7H-5,8-dioxonaphth-2-yl]-ethanoneoxime-O-propylsulfonate, 2,2,2-trifluoro-1-[4-methoxycarbonylmethoxyphenyl]-ethanoneoxime-O-propylsulfonate, 2,2,2-trifluoro-1-[4-(methoxycarbonyl)-(4-amino-1-oxa-pent-1-yl)-phenyl]-ethanoneoxime-O-propylsulfonate, 2,2,2-trifluoro-1-[3,5-dimethyl-4-ethoxyphenyl]-ethanoneoxime-O-propylsulfonate, 2,2,2-trifluoro-1-[4-benzyloxyphenyl]-ethanoneoxime-O-propylsulfonate, 2,2,2-trifluoro-1-[2-thiophenyl]-ethanoneoxime-O-propylsulfonate, 2,2,2-trifluoro-1-[1-dioxa-thiophen-2-yl]-ethanoneoxime-O-propylsulfonate, 2,2,2-trifluoro-1-(4-(3-(4-(2,2,2-trifluoro-1-(trifluoromethanesulfonyloxyimino)-ethyl)-phenoxy)-propoxy)-phenyl) ethanoneoxime(trifluoromethanesulfonate), 2,2,2-trifluoro-1-(4-(3-(4-(2,2,2-trifluoro-1-(1-propanesulfonyloxyimino)-ethyl)-phenoxy)-propoxy)-phenyl)ethanoneoxime(1-propanesulfonate), and 2,2,2-trifluoro-1-(4-(3-(4-(2,2,2-trifluoro-1-(1-butanesulfonyloxyimino)-ethyl)-phenoxy)-propoxy)-phenyl)ethanoneoxime(1-butanesulfonate) and may further include 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanoneoxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzene sulfonyloxy)phenylsulfonyloxyimino)-ethyl)-phenoxy)-propoxy)-phenyl)ethanoneoxime(2,5-bis(4-methylphenylsulfonyloxy)benzenesulfonyloxy)phenylsulfonate).

Examples of the oxime sulfonate may include α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Examples of the oxime sulfonates may also specifically include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Examples of bisoximesulfonates may particularly include bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy) imino)-p-phenylenediacetonitrile, bis(α-(4-toluenesulfonyloxy)imino)-p-phenylenediacetonitrile, bis (α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy) imino)-m-phenylenediacetonitrile, bis(α-(benzenesulfonyloxy)imino)-m-phenylenediacetonitrile, bis (α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy) imino)-m-phenylenediacetonitrile, and bis(α-(4-methoxybenzenesulfonyloxy)imino)-m-phenylenediacetonitrile.

Of these photoacid generators, the sulfonium salts, the bissulfonyldiazomethanes, the N-sulfonyloxyimide, the oxime-O-sulfonates, and the glyoxime derivatives are preferably used. The sulfonium salts, the bissulfonyldiazomethanes, the N-sulfonyloxyimide, and the oxime-O-sulfonates are more preferably used as the photoacid generator.

Specific examples of the preferable photoacid generator may include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium-2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy) benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)ethanesulfonate, bis(tert-butylsulfonyl)diazomethane, bis(cyclohexylsulfonyl)diazomethane, bis(2,4-dimethylphenylsulfonyl)diazomethane, bis(4-n-hexyloxy) phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

Namely, as described above, examples of the photoacid generator included in the coating composition including the polysiloxane according to the present invention may include onium salt compounds, sulfonimide compounds, and disulfonyldiazomethane compounds.

Examples of the onium salt compound may include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate and sulfonium salt compounds such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Examples of the sulfonimide compounds may include N-(trifluoromethanesulfonyloxy) succinimide, N-(nonafluoro-normal-butanesulfonyloxy)succinimide, N-(camphorsulfonyloxy)succinimide, and N-(trifluoromethanesulfonyloxy)naphthalimide.

Examples of the disulfonyldiazomethane compounds may include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used singly or in combination of two or more of the photoacid generators.

The ratio of the photoacid generator is 0.01 part by mass to 30 parts by mass, 0.01 part by mass to 15 parts by mass, or 0.1 part by mass to 10 parts by mass relative to 100 parts by mass of the condensation product (polyorganosiloxane) in the case where the photoacid generator is used.

In the present invention, a thermal acid generator may be added in the case where the composition is used as the coating composition. Examples of the thermal acid generator may include onium salts such as ammonium salts, sulfonium salts, and phosphonium salt and the counter anion may include sulfonate, antimonate, and phosphate. The ammonium salt of trifluoromethanesulfonic acid is particularly preferable.

These thermal acid generators may be used singly or in combination of two or more of the thermal acid generators.

The ratio of the thermal acid generator is 0.01 part by mass to 30 parts by mass, 0.01 part by mass to 15 parts by mass, or 0.1 part by mass to 10 parts by mass relative to 100 parts by mass of the condensation product (polyorganosiloxane) in the case where the thermal acid generator is used.

One or more nitrogen-containing organic compounds may be blended as a basic compound (quencher) in the case where the composition according to the present invention is used as a resist composition. The ratio of the quencher is 0.01 part by mass to 30 parts by mass, 0.01 part by mass to 15 parts by mass, or 0.1 part by mass to 10 parts by mass relative to 100 parts by mass of the condensation product (polyorganosiloxane) in the case where the quencher is used.

A compound that can reduce the diffusion rate during the diffusion of the acid generated from the acid generator into the resist film is suitable as the nitrogen-containing organic compound. Addition of the nitrogen-containing organic compound allows the diffusion rate of the acid in the resist film to be reduced, the resolution to be improved, the change in sensitivity after exposure to be reduced, dependency of the substrate or environment to be reduced, and the exposure margin and pattern profiles to be improved.

Examples of such a nitrogen-containing organic compound (quencher) may include primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, ammonia, ammonium salts, and sulfonium salts.

Such a nitrogen-containing organic compound may be a compound of general Formula (C-1).

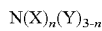   Formula (C-1)

In Formula (C-1), n is an integer of 0, 1, 2, or 3. X may be the same as or different from each other and may be a group of Formulas (X1), (X2), or (X3). Y is a hydrogen atom or the same or different linear, branched, or cyclic alkyl group having a carbon atom number of 1 to 20 or 1 to 10 and may contain an ether group or a hydroxy group. The alkyl group may be exemplified by the above examples.

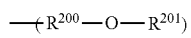   Formula (X-1)

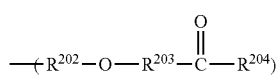   Formula (X-2)

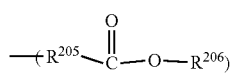   Formula (X-3)

In Formulas (X-1) to (X-3), $R^{200}$, $R^{202}$, and $R^{205}$ are linear or branched alkylene groups having a carbon atom number of 1 to 10, and $R^{201}$ and $R^{204}$ are hydrogen atoms, linear, branched, or cyclic alkyl groups having a carbon atom number of 1 to 20 or 1 to 10 and may include one or more hydroxy groups, ether groups, ester groups, or lactone rings.

$R^{203}$ is a single bond or a linear or branched alkylene group having a carbon atom number of 1 to 10.

$R^{206}$ is a linear, branched, or cyclic alkyl group having a carbon atom number of 1 to 20 or 1 to 10 and may include one or more hydroxy groups, ether groups, ester groups, or lactone rings.

The alkyl group is as described above and the alkylene group may be a functional group derived from the alkyl group.

The nitrogen-containing organic compounds having a cyclic structure illustrated below can be presented as examples.

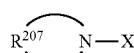   Formula (C-2)

In the formula (C-2), X is as defined above, $R^{207}$ is a linear or branched alkylene group having a carbon atom number of 1 to 20, 1 to 10, or 2 to 20 and may include one or more carbonyl groups, ether groups, ester groups, or sulfide groups. The alkylene group is a functional group derived from the alkyl group and the alkyl group may be exemplified by the above examples.

A nitrogen-containing organic compounds containing a cyano group can be presented as examples.

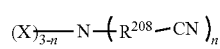   Formula (C-3)

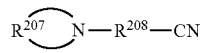   Formula (C-4)

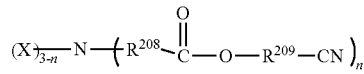   Formula (C-5)

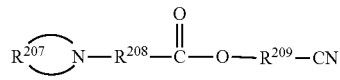   Formula (C-6)

In Formulas (C-3) to (C-6), X and $R^{207}$ are as described above and n is an integer of 1, 2, or 3. $R^{208}$ and $R^{209}$ are the same or different linear or branched alkylene groups having a carbon atom number of 1 to 10 or 1 to 4.

The nitrogen-containing organic compounds having an imidazole skeleton can be presented as examples.

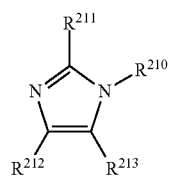   Formula (C-7)

In Formula (C-7), $R^{210}$ is a linear, branched, or cyclic alkyl group having a carbon atom number of 1 to 20, 1 to 10, or 2 to 20 and having a polar functional group and examples of the polar functional group may include hydroxy group, carbonyl group, ester group, ether group, sulfide group, carbonate group, cyano group, or acetal group. $R^{211}$, $R^{212}$, and $R^{213}$ are hydrogen atoms, linear, branched, or cyclic alkyl groups, aryl groups, or aralkyl groups having a carbon atom number of 1 to 10.

The nitrogen-containing organic compounds having a benzimidazole skeleton can be presented as examples.

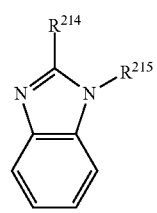   (Formula (C-8)

In Formula (C-8), $R^{214}$ is a hydrogen atom, a linear, branched, or cyclic alkyl group having a carbon atom number of 1 to 10, or a $C_{6-40}$ aryl group or aralkyl group. $R^{215}$ is a linear, branched, or cyclic alkyl group having a carbon atom number of 1 to 20 or 1 to 10 and having a polar functional group. The aralkyl group is a combination of an aryl group and an alkyl group and the aryl group and alkyl group can be exemplified by the above examples. The polar functional group can be exemplified by the above examples.

The nitrogen-containing organic compounds having a polar functional group can be presented as examples.

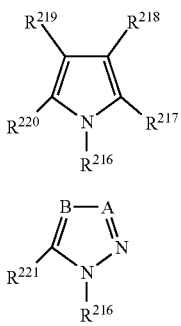

Formula (C-9)

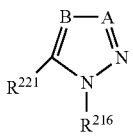

Formula (C-10)

In Formulas (C-9) and (C-10), A is a nitrogen atom or =C—$R^{222}$ and B is a nitrogen atom or =C—$R^{223}$. $R^{216}$ is a linear, branched or cyclic alkyl group having a carbon atom number of 1 to 20, 1 to 10, or 2 to 20 and having a polar functional group. $R^{217}$, $R^{218}$, $R^{219}$, and $R^{220}$ are hydrogen atoms, linear, branched, or cyclic alkyl groups having a carbon atom number of 1 to 10, or $C_{6-40}$ aryl groups. $R^{217}$ and $R^{218}$, and $R^{219}$ and $R^{220}$ each may be bonded to each other to form a benzene ring, a naphthalene ring, or a pyridine ring. $R^{221}$ is a hydrogen atom or a linear, branched, or cyclic alkyl group or aryl group having a carbon atom number of 1 to 10. $R^{222}$ and $R^{223}$ are hydrogen atoms or linear, branched, or cyclic alkyl groups or aryl groups having a carbon atom number of 1 to 10. $R^{221}$ and $R^{223}$ may be bonded to each other to form a benzene ring or a naphthalene ring.

The nitrogen-containing organic compounds having an aromatic carboxylic acid ester structure can be presented as examples.

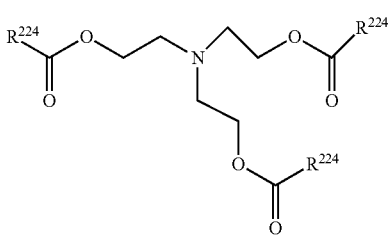

Formula (C-11)

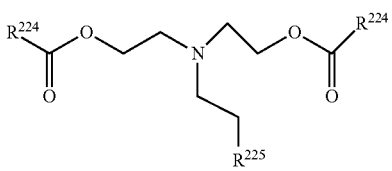

Formula (C-12)

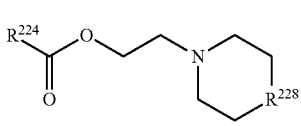

Formula (C-13)

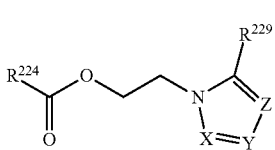

Formula (C-14)

In Formula (C-11) to (C-14), $R^{224}$ is a $C_{6-40}$ aryl group or a $C_{4-20}$ heteroaromatic group and may be substituted with a linear, branched, or cyclic alkyl group having a carbon atom number of 1 to 10 or 2 to 10, a $C_{6-40}$ aryl group, a $C_{7-20}$ aralkyl group, a $C_{1-10}$ alkoxy group, a $C_{1-10}$ acyloxy group, or a $C_{1-10}$ alkylthio group in which a part of or all of the hydrogen atoms are substituted with halogen atoms. $R^{225}$ is $COOR^{226}$, $OR^{227}$ or a cyano group. $R^{226}$ is a $C_{1-10}$ alkyl group in which a part of methylene groups may be substituted with oxygen atoms. $R^{227}$ is a $C_{1-10}$ alkyl group or acyl group in which a part of methylene groups may be substituted with oxygen atoms. $R^{228}$ is a single bond, methylene group, ethylene group, a sulfur atom, or —O(CH$_2$CH$_2$O)$_n$— group, and n is an integer of 0 to 4. $R^{229}$ is a hydrogen atom, methyl group, ethyl group, or phenyl group. X is a nitrogen atom or $CR^{230}$. Y is a nitrogen atom or $CR^{231}$. Z is a nitrogen atom or $CR^{232}$. $R^{230}$, $R^{231}$ and $R^{232}$ are hydrogen atoms, methyl groups, or phenyl groups, or $R^{230}$ and $R^{231}$ or $R^{231}$ and $R^{232}$ may be bonded to each other to form a heteroaromatic ring.

The nitrogen-containing organic compounds having a 7-oxanorbornane-2-carboxylic acid ester structure can be presented as examples.

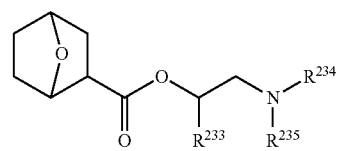

Formula (C-15)

In Formula (C-15), $R^{233}$ is a hydrogen atom or a linear, branched, or cyclic alkyl group having a carbon atom number of 1 to 10. $R^{234}$ and $R^{235}$ each are a $C_{1-20}$ or $C_{1-10}$ alkyl group, a $C_{6-40}$ aryl group, or a $C_{7-20}$ aralkyl group that may contain a polar functional group and in which a part of the hydrogen atoms may be substituted with halogen atoms. $R^{234}$ and $R^{235}$ may be bonded to each other to form a $C_{2-20}$ heterocycle or heteroaromatic ring.

The nitrogen-containing organic compounds having a group that can be eliminated by the action of an acid can be presented as examples.

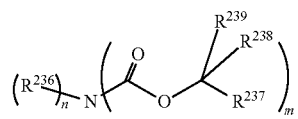

Formula (C-16)

In Formula (C-16), $R^{236}$ is a hydrogen atom, a $C_{1-10}$ alkyl group or cycloalkyl group, or a $C_{6-40}$ aryl group or aralkyl group. In the case where n is 2 or more, two $R^{236}$s may be bonded to each other to form a heterocyclic hydrocarbon group. $R^{237}$, $R^{238}$ and $R^{239}$ each are a hydrogen atom, a $C_{1-10}$ alkyl group or cycloalkyl group, or a $C_{6-40}$ aryl group, aralkyl group, or alkoxyalkyl group. n is 0 to 2, m is 1 to 3, or n+m is 3.

These nitrogen-containing organic compounds can be exemplified as follows.

Examples of primary aliphatic amines may include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines may include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of tertiary aliphatic amines may include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of mixed amines may include dimethylethylamine, methylethylpropylamine, benzylamine, phenethylamine, and benzyldimethylamine.

Specific examples of aromatic amines and heterocyclic amines may include aniline derivatives (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N, N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole, and N-methylpyrrol), oxazole derivatives (such as oxazole and isoxazole), thiazole derivatives (such as thiazole and isothiazole), imidazole derivatives (such as imidazole, 4-methylimidazole, and 4-methyl-2-phenylimidazole), pyrazole derivatives, furazan derivatives, pyrroline derivatives (such as pyrroline and 2-methyl-1-pyrroline), pyrrolidine derivatives (such as pyrrolidine, N-methylpyrrolidine, pyrrolidinone, and N-methylpyrrolidone), imidazoline derivatives, imidazolidine derivatives, pyridine derivatives (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compound having a carboxy group may include aminobenzoic acid, indolecarboxylic acid, and amino acid derivatives (such as nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the nitrogen-containing compounds having a sulfonyl group may include 3-pyridinesulfonic acid and pyridinium p-toluenesulfonate.

Examples of the nitrogen-containing compounds having a hydroxy group, the nitrogen-containing compounds having a hydroxyphenyl group, and the alcoholic nitrogen-containing compounds may include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyurolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide.

Examples of amides may include formamide, N-methylformamide, N,N-dimethylformamide, acetamide, N-methylacetamide, N,N-dimethylacetamide, propionamide, benzamide, and 1-cyclohexylpyrrolidone. Examples of imides may include phthalimide, succinimide, and maleimide. Examples of carbamates may include N-t-butoxycarbonyl-N,N-dicyclohexylamine, N-t-butoxycarbonylbenzimidazole, and oxazolidinone.

The sulfonium salts of sulfonic acid, nitric acid, or carboxylic acid in which the α-position is not fluorinated, the iodonium salts of sulfonic acid, nitric acid, or carboxylic acid in which the α-position is not fluorinated, the ammonium salts of sulfonic acid, nitric acid, or carboxylic acid in which the α-position is not fluorinated, and the onium salts of ammonium halides, sulfonium halides, iodonium halides, or the like may be used. Examples of the carboxylic acid may include maleic acid, acetic acid, propionic acid, and formic acid. Examples of halogen may include fluorine, chlorine, bromine, and iodine and chlorine is preferably used.

Specific examples of the sulfonium cation may include triphenylsulfonium, 4-hydroxyphenyldiphenylsulfonium, bis(4-hydroxyphenyl)phenylsulfonium, tris(4-hydroxyphenyl)sulfonium (4-tert-butoxyphenyl)diphenylsulfonium, bis (4-tert-butoxyphenyl)phenylsulfonium, tris(4-tert-butoxyphenyl)sulfonium, (3-tert-butoxyphenyl) diphenylsulfonium, bis(3-tert-butoxyphenyl) phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl) sulfonium, diphenyl(4-thiophenoxyphenyl) sulfonium, (4-tert-butoxycarbonylmethyloxyphenyl)diphenylsulfonium, tris(4-tert-butoxycarbonylmethyloxyphenyl) sulfonium, (4-tert-butoxyphenyl)bis(4-dimethylaminophenyl) sulfonium, tris(4-dimethylaminophenyl) sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl 2-thienylsulfonium, 4-n-butoxynaphthyl-1-thiacyclopentanium, 2-n-butoxynaphthyl-1- thiacyclopentanium, 4-methoxynaphthyl-1-thiacyclopentanium, and 2-methoxynaphthyl-1-thiacyclopentanium. More preferable examples may include triphenylsulfonium, 4-tert-butylphenyldiphenylsulfonium, 4-tert-butoxyphenyldiphenylsulfonium, tris(4-tert-butylphenyl)sulfonium, and (4-tert-butoxycarbonylmethyloxyphenyl)diphenylsulfonium.

Furthermore, more preferable examples may include 4-(methacryloyloxy)phenyldiphenylsulfonium, 4-(acryloyloxy)phenyldiphenylsulfonium, 4-(methacryloyloxy)phenyldimethylsulfonium, and 4-(acryloyloxy)phenyldimethylsulfonium.

Examples of the ammonium cations may include ammonium cations in which proton is added to a nitrogen atom of ammonia, primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, and alcoholic nitrogen-containing compounds, and quaternary ammonium cations. Examples of quaternary ammonium cations may include tetraethylammonium and benzyltriethylammonium.

A surfactant is effective for reducing generation of pinholes and striations during application of the coating composition including the polysiloxane according to the present invention to the substrate.

Examples of the surfactant included in the coating composition including the polysiloxane according to the present invention may include nonionic surfactant such as polyoxyethylene alkyl ethers such as polyoxyethylene lauryl ethers, polyoxyethylene stearyl ethers, polyoxyethylene cetyl ethers, and polyoxyethylene oleyl ethers; polyoxyethylene alkylallyl ethers such as polyoxyethylene octylphenol ethers and polyoxyethylene nonylphenol ethers; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorochemical surfactants such as Eftop EF301, EF303, and EF352 (trade name, manufactured by TOHKEM PRODUCTS CORPORATION), Megafac F171, F173, R-08, R-30, R-30N, and R-40LM (trade name, manufactured by DIC Corporation), Fluorad FC430 and FC431 (manufactured by Sumitomo 3M Ltd.), and Asahi guard AG710, and Surflon S-382, SC101, SC102, SC103, SC104, SC105, and SC106 (trade name, Asahi Glass Co., Ltd.); and Organosiloxane Polymer KP341 (manufactured by Shin-Etsu Chemical Co., Ltd.). These surfactants may be used singly or in combination of two or more of the surfactants. The ratio of the surfactant is 0.0001 part by mass to 5 parts by mass, 0.001 part by mass to 1 part by mass, or 0.01 part by mass to 1 part by mass relative to 100 parts by mass of the condensation product (polyorganosiloxane) in the case where the surfactant is used.

A rheology modifier, an adhesion assistance agent, and the like can be added to the coating composition including the polysiloxane according to the present invention. The rheology modifier is effective for improving flowability of the underlayer film forming composition. The adhesion assistance agent is effective for improving adhesiveness between the underlayer film and the semiconductor substrate or the resist.

As a solvent used for the coating composition including the polysiloxane according to the present invention, any solvent may be used without particular limitation as long as the solvent can dissolve the solid content. Examples of the solvent may include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methyl propionate, methyl 3-methoxy-2-methyl propionate, methyl 2-hydroxy-3-methyl butyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, 4-methyl-2-pentanol, and γ-butyrolactone. These solvents may be used singly or in combination of two or more of the solvents.

The organic underlayer film used in the present invention is obtained by applying and curing an organic underlayer film forming composition. Curing can be cured by heating at about 150° C. to about 230° C. The organic underlayer film forming composition may include a resin for coating films and solvents. The organic underlayer film forming composition may include a crosslinking agent, an acid, an acid generator, a light absorbing compound, and the like, if necessary. The resin for coating films is a resin that can mainly form films and examples of the resin may include a novolac resin, a condensed epoxy resin, a (meth)acrylic resin, a polyether resin, or a silicon-containing resin. The solid content of the composition is 0.1% by mass to 70% by mass or 0.1% by mass to 60% by mass. The solid content is a content ratio in which the solvent component is removed from the film forming composition. The resin for coating films may be included in the solid content in a ratio of 1% by mass to 99.9% by mass, 50% by mass to 99.9% by mass, 50% by mass to 95% by mass, or 50% by mass to 90% by mass. The resin for coating films has a weight average molecular weight of 600 to 1000000, or 600 to 200000.

The silicon hard mask used in the present invention is obtained by applying and curing a silicon hard mask forming composition. Examples of the silicon hard mask forming composition may include a condensation product obtained by hydrolyzing the hydrolyzable silane. This is a polysiloxane and also includes an organopolysiloxane. The hydrolyzable silane can be obtained by hydrolyzing at least one hydrolyzable silane selected from the group consisting of a hydrolyzable silane having four hydrolyzable groups, a hydrolyzable silane having three hydrolyzable groups, a hydrolyzable silane having two hydrolyzable groups, and a hydrolyzable silane having one hydrolyzable group. The hydrolysis is carried out by adding a catalyst (for example, an acid catalyst or a basic catalyst) in an organic solvent. Thereafter, the hydrolyzed product is condensed by heating to obtain the hydrolysis-condensation product (polysiloxane or organopolysiloxane). The solid content of the composition is 0.1% by mass to 70% by mass or 0.1% by mass to 60% by mass. The solid content is a content ratio in which the solvent component is removed from the film forming composition. The resin for coating films may be included in the solid content in a ratio of 1% by mass to 99.9% by mass, 50% by mass to 99.9% by mass, 50% by mass to 95% by mass, or 50% by mass to 90% by mass. The resin for coating films has a weight average molecular weight of 600 to 1,000,000, or 600 to 200,000.

The silicon hard mask can also be formed by vapor deposition.

The composition used in the present invention is applied onto a substrate (for example, a silicon wafer substrate, a silicon/silicon dioxide coated substrate, a silicon nitride substrate, a glass substrate, an ITO substrate, a polyimide substrate, and a low dielectric constant material (low-k material) coated substrate) used in the production of semiconductor devices by an appropriate coating method such as a method using a spinner or a coater.

The applied composition is baked to form a film. The baking conditions are appropriately selected from a baking temperature of 80° C. to 250° C. and a baking time of 0.3 minute to 60 minutes. Preferably the conditions are a baking temperature of 150° C. to 250° C. and a baking time of 0.5 minute to 2 minutes. A film thickness of the formed film is, for example, 10 nm to 1,000 nm, 20 nm to 500 nm, 50 nm to 300 nm, or 100 nm to 200 nm.

For example, a photoresist layer is formed on the hard mask. The photoresist layer can be formed by a known method, that is, applying the photoresist composition solution onto the underlayer film and baking the applied photoresist composition. A thickness of the photoresist is, for example, 50 nm to 10,000 nm, 100 nm to 2,000 nm, or 200 nm to 1,000 nm.

In the present invention, the organic underlayer film is formed on the substrate. Thereafter, a hard mask is formed on the organic underlayer film and the photoresist can be further applied onto the hard mask. Thus, even when the pattern width of the photoresist is narrowed and the photoresist is thinly applied in order to prevent pattern collapse, the substrate can be processed by selecting an appropriate etching gas. For example, the hard mask can be processed by using a fluorine-based gas serving as an etching gas, which has a sufficiently high etching rate to the photoresist, and the organic underlayer film can be processed by using an oxygen-based gas serving as an etching gas, which has a sufficiently high etching rate to the hard mask. The substrate can be processed by reversing the pattern.

The photoresist is not particularly limited as long as the photoresist is sensitive to the light used for exposure. Both negative type photoresist and positive type photoresist may be used. Examples of the photoresist may include a positive type photoresist including a novolac resin and 1,2-naphthoquinone diazide sulfonic acid ester, a chemically amplified photoresist including a binder having a group that increases an alkali dissolution rate by decomposing with an acid and a photoacid generator, a chemically amplified photoresist including a low molecular weight compound that increases an alkali dissolution rate of the photoresist by decomposing with an acid, an alkali soluble binder, and a photo acid generator, and a chemically amplified photoresist including a binder having a group that increases an alkali dissolution rate by decomposing with an acid, a low molecular weight compound that increases an alkali dissolution rate of the photoresist by decomposing with an acid, and a photoacid generator. Examples of the photoresist may include APEX-E (product name) manufactured by Shipley Company L.L.C., PAR710 (product name) manufactured by Sumitomo Chemical Co., Ltd., and SEPR 430 (product name) manufactured by Shin-Etsu Chemical Co., Ltd. Examples of the photoresist may also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Subsequently, exposure is carried out through the predetermined mask. KrF excimer laser (a wavelength of 248 nm), ArF excimer laser (a wavelength of 193 nm), and $F_2$ excimer laser (a wavelength of 157 nm) can be used for the exposure. After exposure, post exposure bake can be carried out, if necessary. The post exposure baking is carried out under appropriately selected conditions of a heating temperature of 70° C. to 150° C. and a heating time of 0.3 minute to 10 minutes.

In the present invention, a resist for electron beam lithography or a resist for EUV lithography can be used instead of the photoresist as the resist. Both negative type electron beam resist and positive type electron beam resist can be used as the electron beam resist. Examples of the electron beam resist may include a chemically amplified resist including the acid generator and a binder having a group that changes an alkali dissolution rate by decomposing with an acid, a chemically amplified resist including an alkali-soluble binder, an acid generator and a low molecular weight compound that changes an alkali dissolution rate of the resist by decomposing with an acid, a chemically amplified resist including the acid generator, a binder having a group that changes an alkali dissolution rate by decomposing with an acid, and a low molecular weight compound that changes an alkali dissolution rate of the resist by decomposing with an acid, a non-chemically amplified resist including a binder having a group that changes an alkali dissolution rate by decomposing with electron beams, and a non-chemically amplified resist including a binder having a moiety that is cut with electron beams and changes an alkali dissolution rate. Using the electron beams as an irradiation source, a resist pattern can also be formed in the case where these electron beam resists are used similar to the case where the photoresists are used.

As the EUV resist, a methacrylate resin-based resist, a methacrylate-polyhydroxystyrene hybrid resin-based resist, and a polyhydroxystyrene resin-based resist can be used. Both negative type EUV resist and positive type EUV resist can be used as the EUV resist. Examples of the EUV resist may include a chemically amplified resist including the acid generator and a binder having a group that changes an alkali dissolution rate by decomposing with an acid, a chemically amplified resist including an alkali-soluble binder, an acid generator and a low molecular weight compound that changes an alkali dissolution rate of the resist by decomposing with an acid, a chemically amplified resist including the acid generator, a binder having a group that changes an alkali dissolution rate by decomposing with an acid, and a low molecular weight compound that changes an alkali dissolution rate of the resist by decomposing with an acid, a non-chemically amplified resist including a binder having a group that changes an alkali dissolution rate by decomposing with EUV light, and a non-chemically amplified resist including a binder having a moiety that is cut with EUV light and changes an alkali dissolution rate.

Subsequently, development is carried out with a development liquid (for example, an alkaline development liquid). This results in removing the exposed part of the photoresist to form a pattern of the photoresist, for example, in the case where the positive type photoresist is used.

Examples of the development liquid may include alkali solutions such as an aqueous solution of alkali metal hydroxide such as potassium hydroxide and sodium hydroxide, an aqueous solution of quaternary ammonium hydroxide such as tetramethylammonium hydroxide, tetraethylammonium hydroxide, and choline, and an aqueous solution of amine such as ethanolamine, propylamine, and ethylenediamine. The surfactant and the like may also be added to the development liquid. The development conditions are appropriately selected from a temperature of 5° C. to 50° C. and a time of 10 seconds to 600 seconds.

In the present invention, an organic solvent can also be used as the development liquid. After exposure, development is carried out with a development liquid (solvent). This allows an unexposed part of the photoresist to be removed to form a pattern of the photoresist, for example, in the case where the positive type photoresist is used.

Examples of the development liquid may include methyl acetate, butyl acetate, ethyl acetate, isopropyl acetate, amyl acetate, isoamylacetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy-butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxy-pentyl acetate, 4-methyl-4-methoxy-pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. The surfactant and the like may also be added to the development liquid. The development conditions are appropriately selected from a temperature of 5° C. to 50° C. and a time of 10 seconds to 600 seconds.

The coating composition including the polysiloxane is applied to the resist pattern and the resist pattern surface is exposed by etching back, followed by etching or ashing the resist pattern to allow the pattern to be reversed.

The hard mask is removed by using thus formed reversed pattern as a protective film. Subsequently, the organic underlayer film (lower layer) is removed by using a film formed of the reversed pattern and the hard mask as a protective film. Finally, a semiconductor device can be produced by the step of processing the substrate using a patterned organic underlayer film.

In the present invention, examples of the method for reversing the pattern may include a method in which the coating composition is applied onto a resist pattern and the resist pattern is etched or ashed to reverse the pattern and a method in which the coating composition is applied onto the pattern of the organic underlayer film to which the resist pattern is transferred and the organic underlayer film is etched or ashed to reverse the pattern.

First, the hard mask in a part where the photoresist is removed is removed by dry etching to expose the organic underlayer film. Examples of used gases for dry etching of the hard mask may include tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane, and dichloroborane. The hard mask is preferably dry-etched by using the halogen-based gas. The photoresist made of organic substances is basically difficult to be removed by the dry etching using the halogen-based gas. On the contrary, the hard mask that contains many silicon atoms is rapidly removed by the halogen-based gas. Therefore, a decrease in the film thickness of the photoresist accompanying the dry etching of the hard mask can be reduced. As a result, the photoresist can be used as a thin film. Dry etching of the hard mask is preferably carried out by a fluorine-based gas. Examples of the fluorine-based gas may include tetrafluoromethane ($CF_4$), perfluorocyclobutane ($C_4F_8$), perfluoropropane ($C_3F_8$), trifluoromethane, and difluoromethane ($CH_2F_2$).

Thereafter, the organic underlayer film is removed by using a film comprising the patterned photoresist and the hard mask as a protective film. The organic underlayer film (lower layer) is preferably dry-etched by using an oxygen-based gas. This is because the hard mask that contains many silicon atoms is difficult to be removed by dry etching with the oxygen-based gas.

In the step of applying the coating composition including the polysiloxane onto the patterned organic underlayer film and exposing the organic underlayer film surface by etching back, the fluorine-based gas is used as the gas used for the etching back. Thereafter, the pattern can be reversed by etching or ashing the organic underlayer film. Thereafter, a semiconductor device can be produced by the step of processing the substrate with the reversed polysiloxane film.

In the present invention, the resist pattern can be formed by the above lithography method. The resist pattern, however, can also be formed by a nanoimprinting method.

A nanoimprinting composition which is cured by heat or light is applied onto a substrate and a mold is pressed to form a resist pattern by thermosetting or photocuring.

More specifically, the semiconductor device can be produced by the steps of forming a pattern on a semiconductor substrate by a nano-imprinting method, applying the coating composition onto the pattern to embed a polysiloxane, etching or ashing the pattern formed by the nano-imprinting method to reverse the pattern, and processing the substrate using the polysiloxane film.

In the present invention, a resist composition (photosensitive composition) can be made by adding the photoacid generator and, if necessary, the quencher to the composition including the polysiloxane. In this resist composition, the photoacid generator, the various additives, and the solvent used in the above coating composition may be used.

A semiconductor device can be produced by the steps of forming a resist film on a semiconductor substrate using the resist composition according to the present invention; exposing the resist film and developing the resist after the exposure to obtain a resist pattern; and processing the substrate using the patterned resist film.

For the exposure, i-line (wavelength 365 nm), KrF excimer laser (wavelength 248 nm), ArF excimer laser (wavelength 193 nm) and $F_2$ excimer laser (wavelength 157 nm), and the like can be used. Broadband light in which these wavelengths are mixed can also be used.

EXAMPLE (Synthesis Example 1) Production of Polysiloxane Solution Prepared from Tetraethoxysilane (TEOS):Methyltriethoxysilane (MTEOS)=85 mol %:15 mol %

In a flask, 100.09 g of tetraethoxysilane (included in a ratio of 85 mol % in total silane), 15.08 g of methyltriethoxysilane (included in a ratio of 15 mol % in total silane), and 172.52 g of acetone were placed. A dropping funnel containing 30.37 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 196.3 g of a polysiloxane solution (corresponding to Formula (1-1)). As a result of measurement by a baking method, the solid content in the obtained reaction product was 19.7% by mass.

$^1$H-NMR (500 MHz, $CD_3COCD_3$): δ=6.441 (br, 0.70H), 3.847 (br, 0.20H), 1.185 (br, 0.30H), 0.142 (br, 0.45H)
Assumed that the integrated value of Si-Me is 0.45H
GPC (in terms of polystyrene): weight average molecular weight Mw=2,004

(Synthesis Example 2) Production of Polysiloxane Solution Prepared from TEOS:MTEOS=75 mol %:25 mol %

In a flask, 100.02 g of tetraethoxysilane (included in a ratio of 75 mol % in total silane), 28.52 g of methyltriethoxysilane (included in a ratio of 25 mol % in total silane), and 192.43 g of acetone were placed. A dropping funnel containing 43.25 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the resultant reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 225.6 g of a polysiloxane solution (corresponding to Formula (1-1)). As a result of measurement by a baking method, the solid content in the obtained reaction product was 19.3% by mass.

$^1$H-NMR (500 MHz, $CD_3COCD_3$): δ=6.718 (br, 0.61H), 3.845 (br, 0.20H), 1.189 (br, 0.40H), 0.140 (br, 0.75H)
Assumed that the integrated value of Si-Me is 0.75H
GPC (in terms of polystyrene): Mw=1,810

(Synthesis Example 3) Production of Polysiloxane Solution Prepared from TEOS:MTEOS=80 mol %:20 mol %

In a flask, 100.00 g of tetraethoxysilane (included in a ratio of 80 mol % in total silane), 21.41 g of methyltriethoxysilane (included in a ratio of 20 mol % in total silane), and 182.08 g of acetone were placed. A dropping funnel containing 41.11 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 210.6 g of a polysiloxane solution (corresponding to Formula (1-1)). As a result of measurement by a baking method, the solid content in the obtained reaction product was 19.4% by mass.

$^1$H-NMR (500 MHz, $CD_3COCD_3$): δ=6.457 (br, 0.55H), 3.843 (br, 0.21H), 1.193 (br, 0.42H), 0.141 (br, 0.60H)
Assumed that the integrated value of Si-Me is 0.60H
GPC (in terms of polystyrene): Mw=1,634

(Synthesis Example 4) Production of Polysiloxane Solution Prepared from TEOS:MTEOS=90 mol %:10 mol %

In a flask, 100.00 g of tetraethoxysilane (included in a ratio of 90 mol % in total silane), 9.52 g of methyltriethoxysilane (included in a ratio of 10 mol % in total silane), and 164.26 g of acetone were placed. A dropping funnel containing 37.52 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 184.3 g of a polysiloxane solution (corresponding to Formula (1-1)). As a result of measurement by a baking method, the solid content in the obtained reaction product was 20.1% by mass.

$^1$H-NMR (500 MHz, CD$_3$COCD$_3$): δ=6.776 (br, 0.70H), 3.848 (br, 0.19H), 1.150 (br, 0.38H), 0.146 (br, 0.30H)
Assumed that the integrated value of Si-Me is 0.30H
GPC (in terms of polystyrene): Mw=1,996

(Synthesis Example 5) Production of Polysiloxane Solution Prepared from TEOS:MTEOS=95 mol %:5 mol %

In a flask, 100.00 g of tetraethoxysilane (included in a ratio of 95 mol % in total silane), 4.52 g of methyltriethoxysilane (included in a ratio of 5 mol % in total silane), and 156.62 g of acetone were placed. A dropping funnel containing 35.91 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 185.8 g of a polysiloxane solution (corresponding to Formula (1-1)). As a result of measurement by a baking method, the solid content in the obtained reaction product was 18.9% by mass.

$^1$H-NMR (500 MHz, CD$_3$COCD$_3$): δ=6.891 (br, 0.71H), 3.846 (br, 0.20H), 1.188 (br, 0.40H), 0.157 (br, 0.15H)
Assumed that the integrated value of Si-Me is 0.15H
GPC (in terms of polystyrene): Mw=2,184

(Synthesis Example 6) Production of Polysiloxane Solution Prepared from TEOS:MTEOS=100 mol %:0 mol %

In a flask, 100.02 g of tetraethoxysilane (included in a ratio of 100 mol % in total silane) and 150.22 g of acetone were placed. A dropping funnel containing 34.54 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 171.0 g of a polysiloxane solution (corresponding to Formula (1-2)). As a result of measurement by a baking method, the solid content in the obtained reaction product was 19.7% by mass.

$^1$H-NMR (500 MHz, CD$_3$COCD$_3$): δ=6.675 (br, 0.50H), 3.856 (br, 0.12H), 1.193 (br, 0.18H)
Assumed that the integrated value of SiOH is 0.50H
GPC (in terms of polystyrene): Mw=2,440

(Synthesis Example 7) Production of Polysiloxane Solution Prepared from TEOS:Vinyltrimethoxysilane (VinTMOS)=85 mol %:15 mol %

In a flask, 120.00 g of tetraethoxysilane (included in a ratio of 85 mol % in total silane), 15.07 g of vinyltrimethoxysilane (included in a ratio of 15 mol % in total silane), and 202.60 g of acetone were placed. A dropping funnel containing 47.01 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 248.51 g of a polysiloxane solution (corresponding to Formula (1-3)). As a result of measurement by a baking method, the solid content in the obtained reaction product was 19.9% by mass.

$^1$H-NMR (500 MHz, CD$_3$COCD$_3$): δ=6.370 (br, 0.73H), 5.989 (br, 0.45H), 3.858 (br, 0.20H), 1.185 (br, 0.30H)
Assumed that the integrated value of Si-Vin is 0.45H
GPC (in terms of polystyrene): Mw=1,808

(Synthesis Example 8) Production of Polysiloxane Solution Prepared from TEOS:Phenyltrimethoxysilane (PhTMOS)=85 mol %:15 mol %

In a flask, 120.00 g of tetraethoxysilane (included in a ratio of 85 mol % in total silane), 20.16 g of phenyltrimethoxysilane (included in a ratio of 15 mol % in total silane), and 210.23 g of acetone were placed. A dropping funnel containing 47.01 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 278.89 g of a polysiloxane solution (corresponding to Formula (1-4)). As a result of measurement by a baking method, the solid content in the obtained reaction product was 19.5% by mass.

$^1$H-NMR (500 MHz, CD$_3$COCD$_3$): δ=7.734, 7.377 (br, 0.75H), 6.456 (br, 0.59H), 3.867 (br, 0.15H), 1.196 (br, 0.23H)
Assumed that the integrated value of Si-Ph is 0.75H
GPC (in terms of polystyrene): Mw=1,608

(Synthesis Example 9) Production of Polysiloxane Solution Prepared from TEOS:Dimethyldiethoxysilane (DMDEOS)=90 mol %:10 mol %

In a flask, 150.00 g of tetraethoxysilane (included in a ratio of 90 mol % in total silane), 11.86 g of dimethyldiethoxysilane (included in a ratio of 10 mol % in total silane), and 242.79 g of acetone were placed. A dropping funnel containing 56.22 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 286.15 g of a polysiloxane solution (corresponding to Formula (1-5)). As a result of measurement by a baking method, the solid content in the obtained reaction product was 19.6% by mass.

$^1$H-NMR (500 MHz, $CD_3COCD_3$): δ=6.318 (br, 0.66H), 3.853 (br, 0.20H), 1.196 (br, 0.30H), 0.163 (br, 0.60H)

Assumed that the integrated value of Si-Me$_2$ is 0.60H

GPC (in terms of polystyrene): Mw=2,194

(Synthesis Example 10) Protection of Silanol Groups in Prepared Polysiloxane from TEOS:MTEOS=85 mol %:15 mol % with Ethoxyethyl Groups 50.77 g of the polysiloxane solution obtained in Synthesis Example 1, 50.10 g of propylene glycol monomethyl ether acetate, 500.5 mg of pyridium paratoluenesulfonate, and 9.15 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl ether acetate to give 69.6 g of a reaction product (polysiloxane) (the silanol groups existing in Formula (1-1) were converted into the groups of Formula (2)). As a result of measurement by a baking method, the solid content in the obtained reaction product was 20.0% by mass.

$^1$H-NMR (500 MHz, $CD_3COCD_3$): δ=6.678 (br, 0.21H), 5.182 (br, 0.59H), 3.912-3.819 (m, 1.07H), 3.479 (br, 0.59H), 1.359 (br, 1.77H), 1.164 (br, 2.13H), 0.278 (br, 0.45H)

Assumed that the integrated value of Si-Me is 0.45H

Protection ratio: Acetal group/(Acetal group+SiOH group)×100=73.8 mol %

GPC (in terms of polystyrene): Mw=3,164

Thereafter, thus obtained polysiloxane was mixed with additives at the ratio listed in Table 3 and Table 4 and the resultant mixture was filtered through a filter having a pore size of 0.1 m to give a polysiloxane composition for coating for pattern reversal.

(Synthesis Example 11) Protection of Silanol Groups in Prepared Polysiloxane from TEOS:MTEOS=75 mol %:25 mol % with Ethoxyethyl Groups 51.79 g of the polysiloxane solution obtained in Synthesis Example 2, 50.03 g of propylene glycol monomethyl ether acetate, 494.6 mg of pyridium paratoluenesulfonate, and 9.17 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 69.8 g of a reaction product (polysiloxane) (the silanol groups existing in Formula (1-1) were converted into the groups of Formula (2)). As a result of measurement by a baking method, the solid content in the obtained reaction product was 19.9% by mass.

$^1$H-NMR (500 MHz, $CD_3COCD_3$): δ=6.827 (br, 0.17H), 5.171 (br, 0.51H), 3.899-3.808 (m, 0.75H), 3.470 (br, 0.51H), 1.349 (br, 1.53H), 1.158 (1.89H), 0.255 (br, 0.75H)

Assumed that the integrated value of Si-Me is 0.75H

Protection ratio: Acetal group/(Acetal group+SiOH group)×100=75.0 mol %

GPC (in terms of polystyrene): Mw=3,210

Thereafter, thus obtained polysiloxane was mixed with additives at the ratio listed in Table 3 and the resultant mixture was filtered through a filter having a pore size of 0.1 μm to give a polysiloxane composition for coating for pattern reversal.

(Synthesis Example 12) Protection of Silanol Groups in Prepared Polysiloxane from TEOS:MTEOS=80 mol %:20 mol % with Ethoxyethyl Groups 51.54 g of the polysiloxane solution obtained in Synthesis Example 3, 50.23 g of propylene glycol monomethyl ether acetate, 501.6 mg of pyridium paratoluenesulfonate, and 9.17 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 52.6 g of a reaction product (polysiloxane) (the silanol groups existing in Formula (1-1) were converted into the groups of Formula (2)). As a result of measurement by a baking method, the solid content in the obtained reaction product was 20.0% by mass.

$^1$H-NMR (500 MHz, $CD_3COCD_3$): δ=6.693 (br, 0.39H), 5.158 (br, 0.23H), 3.870-3.808 (m, 0.47H), 3.459 (br, 0.23H), 1.331 (br, 0.69H) 1.145 (br, 1.05H), 0.219 (br, 0.60H)

Assumed that the integrated value of Si-Me is 0.60H

Protection ratio: Acetal group/(Acetal group+SiOH group)×100=37.1 mol %

GPC (in terms of polystyrene): Mw=5,619

Thereafter, thus obtained polysiloxane was mixed with additives at the ratio listed in Table 3 and the resultant mixture was filtered through a filter having a pore size of 0.1 μm to give a polysiloxane composition for coating for pattern reversal.

(Synthesis Example 13) Protection of Silanol Groups in Prepared Polysiloxane from TEOS:MTEOS=90 mol %:10 mol % with Ethoxyethyl Groups 49.76 g of the polysiloxane solution obtained in Synthesis Example 4, 50.03 g of propylene glycol monomethyl ether acetate, 496.4 mg of pyridium paratoluenesulfonate, and 9.17 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 48.8 g of a reaction product (polysiloxane) (the silanol groups existing in Formula (1-1) were converted into the groups of Formula (2)). As a result of measurement by a baking method, the solid content in the obtained reaction product was 20.0% by mass.

$^1$H-NMR (500 MHz, $CD_3COCD_3$): δ=6.624 (br, 0.32H), 5.143 (br, 0.25H), 3.856-3.788 (m, 0.47H), 3.437 (br, 0.25H), 1.312 (br, 0.75H) 1.124 (br, 1.08H), 0.207 (br, 0.30H)

Assumed that the integrated value of Si-Me is 0.30H

Protection ratio: Acetal group/(Acetal group+SiOH group)×100=43.9 mol %

GPC (in terms of polystyrene): Mw=7,953

Thereafter, thus obtained polysiloxane was mixed with additives at the ratio listed in Table 3 and the resultant mixture was filtered through a filter having a pore size of 0.1 μm to give a polysiloxane composition for coating for pattern reversal.

(Synthesis Example 14) Protection of Silanol Groups in Prepared Polysiloxane from TEOS:MTEOS=95 mol %:5 mol % with Ethoxyethyl Groups 52.97 g of the polysiloxane solution obtained in Synthesis Example 5, 50.03 g of propylene glycol monomethyl ether acetate, 502.8 mg of pyridium paratoluenesulfonate, and 9.17 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 48.7 g of a reaction product (polysiloxane) (the silanol groups existing in Formula (1-1) were converted into the groups of Formula (2)). As a result of measurement by a baking method, the solid content in the obtained reaction product was 20.1% by mass.

$^1$H-NMR (500 MHz, $CD_3COCD_3$): δ=6.674 (br, 0.43H), 5.171 (br, 0.25H), 3.885-3.816 (m, 0.50H), 3.467 (br, 0.25H), 1.340 (br, 0.75H) 1.149 (br, 1.11H), 0.243 (br, 0.15H)

Assumed that the integrated value of Si-Me is 0.15H

Protection ratio: Acetal group/(Acetal group+SiOH group)×100=36.8 mol %

GPC (in terms of polystyrene): Mw=9,374

Thereafter, thus obtained polysiloxane was mixed with additives at the ratio listed in Table 3 and the resultant mixture was filtered through a filter having a pore size of 0.1 μm to give a polysiloxane composition for coating for pattern reversal.

(Synthesis Example 15) Protection of Silanol Groups in Prepared Polysiloxane from TEOS:MTEOS=100 mol %:0 mol % with Ethoxyethyl Groups 50.79 g of the polysiloxane solution obtained in Synthesis Example 6, 50.17 g of propylene glycol monomethyl ether acetate, 502.2 mg of pyridium paratoluenesulfonate, and 9.18 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 38.1 g of a reaction product (polysiloxane) (the silanol groups existing in Formula (1-2) were converted into the groups of Formula (2)). As a result of measurement by a baking method, the solid content in the obtained reaction product was 19.5% by mass.

$^1$H-NMR (500 MHz, $CD_3COCD_3$): δ=6.654 (br, 0.29H), 5.175 (br, 0.02H), 3.866 (m, 0.12H), 3.472 (br, 0.02H), 1.326 (br, 0.06H) 1.148 (br, 0.21H)

Assumed that the integrated value of SiOH is 0.29

Protection ratio: Acetal group/(Acetal group+SiOH group)×100=6.8 mol %

GPC (in terms of polystyrene): Mw=11,401

Thereafter, thus obtained polysiloxane was mixed with additives at the ratio listed in Table 3 and Table 4 and the resultant mixture was filtered through a filter having a pore size of 0.1 μm to give a polysiloxane composition for coating for pattern reversal.

(Synthesis Example 16) Protection of Silanol Groups in Prepared Polysiloxane from TEOS:MTEOS=85 mol %:15 mol % with Isobutyloxyethyl Groups 51.07 g of the polysiloxane solution obtained in Synthesis Example 1, 50.00 g of propylene glycol monomethyl ether acetate, 500.0 mg of pyridium paratoluenesulfonate, and 10.02 g of isobutyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with methyl isobutyl carbinol to give 43.33 g of a reaction product (polysiloxane) (the silanol groups existing in Formula (1-1) were converted into the groups of Formula (2)). As a result of measurement by a baking method, the solid content in the obtained reaction product was 19.6% by mass.

$^1$H-NMR (500 MHz, $CD_3COCD_3$): δ=6.591 (br, 0.34H), 5.164 (br, 0.35H), 3.905 (br, 0.20H), 3.569 (br, 0.35H), 3.180 (br, 0.35H), 1.822 (br, 0.35H), 1.363 (br, 1.05H), 0.903 (br, 2.40H), 0.246 (br, 0.45H)

Assumed that the integrated value of Si-Me is 0.45H

Protection ratio: Acetal group/(Acetal group+SiOH group)×100=50.7 mol %

GPC (in terms of polystyrene): Mw=5,457

Thereafter, thus obtained polysiloxane was mixed with additives at the ratio listed in Table 3 and the resultant mixture was filtered through a filter having a pore size of 0.1 µm to give a polysiloxane composition for coating for pattern reversal.

(Synthesis Example 17) Protection of Silanol Groups in Prepared Polysiloxane from TEOS:VinTMOS=85 mol %:15 mol % with Ethoxyethyl Groups 100.50 g of the polysiloxane solution obtained in Synthesis Example 7, 100.00 g of propylene glycol monomethyl ether acetate, 1.00 g of pyridium paratoluenesulfonate, and 23.80 g of ethyl vinyl ether were charged to a flask and the resultant reaction solution was reacted at room temperature for 2 days. After completion of the reaction, 200 mL of propylene glycol monomethyl ether acetate, 100 mL of methyl isobutyl ketone, and 200 mL of an acetic acid aqueous solution (0.01 mol/liter) were added and the resultant mixture was extracted. The solvent of the organic phase was removed using an evaporator and further replaced with methyl isobutyl carbinol to give 165.0 g of a reaction product (polysiloxane) (the silanol groups existing in Formula (1-3) were converted into the groups of Formula (2)). As a result of measurement by a baking method, the solid content in the obtained reaction product was 19.3% by mass.

$^1$H-NMR (500 MHz, $CD_3COCD_3$): δ=6.805 (br, 0.13H), 6.165 (br, 0.45H), 5.186 (br, 0.56H), 3.907 (br, 0.18H), 3.818 (br, 0.56H), 3.566 (br, 0.56H), 1.361 (br, 1.68H), 1.161 (br, 1.95H)
Assumed that the integrated value of Si-Vin is 0.45H
Protection ratio: Acetal group/(Acetal group+SiOH group)× 100=81.2 mol %
GPC (in terms of polystyrene): Mw=3,592

Thereafter, thus obtained polysiloxane was mixed with additives at the ratio listed in Table 3 and the resultant mixture was filtered through a filter having a pore size of 0.1 µm to give a polysiloxane composition for coating for pattern reversal.

(Synthesis Example 18) Protection of Silanol Groups in Prepared Polysiloxane from TEOS:PhTMOS=85 mol %:15 mol % with Ethoxyethyl Groups 102.56 g of the polysiloxane solution obtained in Synthesis Example 8, 100.00 g of propylene glycol monomethyl ether acetate, 1.00 g of pyridium paratoluenesulfonate, and 23.80 g of ethyl vinyl ether were charged to a flask and the resultant reaction solution was reacted at room temperature for 2 days. After completion of the reaction, 200 mL of propylene glycol monomethyl ether acetate, 100 mL of methyl isobutyl ketone, and 200 mL of an acetic acid aqueous solution (0.01 mol/liter) were added and the resultant mixture was extracted. The solvent of the organic phase was removed using an evaporator and further replaced with propylene glycol monomethyl ether acetate to give 162.23 g of a reaction product (polysiloxane) (the silanol groups existing in Formula (1-4) were converted into the groups of Formula (2)). As a result of measurement by a baking method, the solid content in the obtained reaction product was 20.3% by mass.

$^1$H-NMR (500 MHz, $CD_3COCD_3$): δ=7.784, 7.474 (br, 0.75H), 6.699 (br, 0.25H), 5.206 (br, 0.69H), 3.907 (br, 0.14H), 3.832 (br, 0.69H), 3.490 (br, 0.69H), 1.375 (br, 2.07H), 1.152 (br, 2.28H)

Assumed that the integrated value of Si-Ph is 0.75
Protection ratio: Acetal group/(Acetal group+SiOH group)× 100=73.4 mol %
GPC (in terms of polystyrene): Mw=2,769

Thereafter, thus obtained polysiloxane was mixed with additives at the ratio listed in Table 3 and the resultant mixture was filtered through a filter having a pore size of 0.1 µm to give a polysiloxane composition for coating for pattern reversal.

(Synthesis Example 19) Protection of Silanol Groups in Prepared Polysiloxane from TEOS:DMDEOS=90 mol %:10 mol % with Ethoxyethyl Groups 102.04 g of the polysiloxane solution obtained in Synthesis Example 9, 100.00 g of propylene glycol monomethyl ether acetate, 1.00 g of pyridium paratoluenesulfonate and 23.80 g of ethyl vinyl ether were charged to a flask and the resultant reaction solution was reacted at room temperature for 2 days. After completion of the reaction, 200 mL of propylene glycol monomethyl ether acetate, 100 mL of methyl isobutyl ketone, and 200 mL of an acetic acid aqueous solution (0.01 mol/liter) were added and the resultant mixture was extracted. The solvent of the organic phase was removed using an evaporator and further replaced with methyl isobutyl carbinol to give 156.62 g of a reaction product (polysiloxane) (the silanol groups existing in Formula (1-5) were converted into the groups of Formula (2)). As a result of measurement by a baking method, the solid content in the obtained reaction product was 19.6% by mass.

$^1$H-NMR (500 MHz, $CD_3COCD_3$): δ=6.659 (br, 0.13H), 5.155 (br, 0.58H), 3.907 (br, 0.19H), 3.790 (br, 0.58H), 3.443 (br, 0.58H), 1.330 (br, 1.74H), 1.129 (br, 2.04H)
Assumed that the integrated value of Si-Me$_2$ is 0.60
Protection ratio: Acetal group/(Acetal group+SiOH group)× 100=81.7 mol %
GPC (in terms of polystyrene): Mw=6,021

Thereafter, thus obtained polysiloxane was mixed with additives at the ratio listed in Table 3 and the resultant mixture was filtered through a filter having a pore size of 0.1 µm to give a polysiloxane composition for coating for pattern reversal.

(Comparative Synthesis Example 1) Production of Polysiloxane Solution Prepared from TEOS:MTEOS=70 mol %:30 mol %

In a flask, 200.00 g of tetraethoxysilane (included in a ratio of 70 mol % in total silane), 73.36 g of methyltriethoxysilane (included in a ratio of 30 mol % in total silane), and 410.04 g of acetone were placed. A dropping funnel containing 91.45 g of a prepared hydrochloric acid aqueous solution (0.01 mol/liter) and equipped with a condenser tube was set to this flask. The hydrochloric acid aqueous solution was slowly added dropwise at room temperature and the resultant reaction solution was stirred for several minutes. Thereafter, the reaction solution was reacted at 85° C. for 4 hours using an oil bath. After completion of the reaction, the flask containing the reaction solution was allowed to be cooled and set to an evaporator. Ethanol, which was generated during the reaction, was removed and acetone was further replaced with propylene glycol monomethyl ether acetate using the evaporator to give 484.0 g of a polysiloxane solution (corresponding to Formula (1-1)). As a result of measurement by a baking method, the solid content in the obtained reaction product was 19.6% by mass.

$^1$H-NMR (500 MHz, CD$_3$COCD$_3$): δ=6.431 (br, 0.60H), 3.839 (br, 0.18H), 1.193 (br, 0.36H), 0.139 (br, 0.90H)

Assumed that the integrated value of Si-Me is 0.90H

GPC (in terms of polystyrene): Mw=2,124

(Comparative Synthesis Example 2) Protection of Silanol Groups in Prepared Polysiloxane from TEOS:MTEOS=70 mol %:30 mol % with Ethoxyethyl Groups 51.19 g of the polysiloxane solution obtained in Comparative Synthesis Example 1, 50.02 g of propylene glycol monomethyl ether acetate, 502.0 mg of pyridium paratoluenesulfonate, and 9.09 g of ethyl vinyl ether were charged to a flask and the resultant reaction solution was reacted at room temperature for 2 days. After completion of the reaction, 150 mL of propylene glycol monomethyl ether acetate, 50 mL of methyl isobutyl ketone, and 150 mL of an acetic acid aqueous solution (0.01 mol/liter) were added and the resultant mixture was extracted. The solvent of the organic phase was removed using an evaporator and further replaced with propylene glycol monomethyl acetate to give 53.4 g of a reaction product (polysiloxane) (the silanol groups existing in Formula (1-1) were converted into the groups of Formula (2)). As a result of measurement by a baking method, the solid content in the obtained reaction product was 19.5% by mass.

$^1$H-NMR (500 MHz, CD$_3$COCD$_3$): δ=6.743 (br, 0.37H), 5.150 (br, 0.17H), 3.851-3.815 (m, 0.38H), 3.456 (br, 0.17H), 1.324 (br, 0.51H), 1.143 (br, 0.83H), 0.201 (br, 0.90H)

* Assumed that the integrated value of Si-Me is 0.90H

Protection ratio: Acetal group/(Acetal group+SiOH group)×100=31.5 mol %

GPC (in terms of polystyrene): Mw=7,416

Thereafter, thus obtained polysiloxane was mixed with additives at the ratio listed in Table 3 and Table 4 and the resultant mixture was filtered through a filter having a pore size of 0.1 μm to give a polysiloxane composition for coating for pattern reversal.

(Storage Stability of Polysiloxane)

The polysiloxane solution in which the silanol groups in the polysiloxane of Synthesis Example 10 were protected with acetal groups was used as Example 1 and Example 2 and the polysiloxane solution in which the silanol groups in the polysiloxane of Synthetic Example 1 were not protected with acetal groups was used as Comparative Example 1 and Comparative Example 2. These polysiloxane solutions were stored at 40° C. or 23° C. for 3 weeks and Mws (weight average molecular weights) of the stored polysiloxane solutions measured by GPC were compared.

TABLE 1

|  | Example 1 | Example 2 |
| --- | --- | --- |
| Polymer | Synthesis Example 10 | Synthesis Example 10 |
| Temperature | 40° C. | 23° C. |
| Time | 3 weeks | 3 weeks |
| Mw | 4,362 | 4,416 |

TABLE 2

|  | Comparative Example 1 | Comparative Example 2 |
| --- | --- | --- |
| Polymer | Synthesis Example 1 | Synthesis Example 1 |
| Temperature | 40° C. | 23° C. |
| Time | 3 weeks | 3 weeks |
| Mw | Gelation | 6,527 |

As listed in Tables 1 and 2, the polysiloxane solution in which the silanol groups were protected with acetal groups indicates less increase in Mw (weight average molecular weight) as compared with the polysiloxane solution in which the silanol groups were not protected with acetal groups and thus had excellent storage stability.

(Preparation of Polysiloxane Composition)

Solutions of the polysiloxane compositions were prepared by mixing each of the polysiloxanes obtained in Synthesis Examples 10 to 19, Comparative Synthesis Example 2, and Synthesis Example 1, PAG (photoacid generator), TAG (thermal acid generator), a curing catalyst, a quencher, and a solvent in the ratio listed in Table 3 and Table 4 and filtering the resultant mixture through a fluorocarbon resin filter having a pore size of 0.1 μm. The addition ratio of the polymer in Table 3 and Table 4 was not the amount of the polymer solution to be added but the amount of the polymer itself to be added.

In Table 3 and Table 4, benzyltriethylammonium chloride is abbreviated as BTEAC as the curing catalyst, triethanolamine as TEA as the quencher, propylene glycol monomethyl ether acetate as PGMEA as the solvent, propylene glycol monoethyl ether as PGEE as the solvent, propylene glycol monomethyl ether as PGME as the solvent, and methyl isobutyl carbinol as MIBC as the solvent. ILP-113 (trade name) is a photoacid generator manufactured by Heraeus Holding and has the following structure.

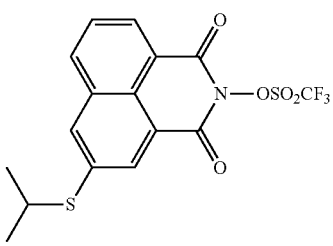

TAG-2689 (trade name) manufactured by King Industries, Inc. was used as the thermal acid generator (its component is an ammonium salt of trifluorosulfonate) and R-30N (trade name) manufactured by DIC Corporation was used as the surfactant. Each addition amount is listed by part by mass.

TABLE 3

|  | Polymer | PAG | Curing catalyst and quencher | Solvent or surfactant | | |
|---|---|---|---|---|---|---|
| Example 3 (part by mass) | Synthesis Example 10 7.52 | ILP-113 0.23 | BTEAC 0.05 | PGMEA 31.24 | PGME 20.88 | |
| Example 4 (part by mass) | Synthesis Example 11 3.09 | ILP-113 0.09 | BTEAC 0.02 | PGMEA 12.86 | PGME 12.88 | PGEE 11.04 |
| Example 5 (part by mass) | Synthesis Example 12 3.09 | ILP-113 0.09 | BTEAC 0.02 | PGMEA 12.88 | PGME 12.88 | PGEE 11.04 |
| Example 6 (part by mass) | Synthesis Example 13 3.09 | ILP-113 0.09 | BTEAC 0.02 | PGMEA 12.88 | PGME 12.88 | PGEE 11.04 |
| Example 7 (part by mass) | Synthesis Example 14 3.09 | ILP-113 0.09 | BTEAC 0.02 | PGMEA 12.90 | PGME 12.88 | PGEE 11.04 |
| Example 8 (part by mass) | Synthesis Example 15 3.09 | ILP-113 0.09 | BTEAC 0.02 | PGMEA 12.80 | PGME 12.88 | PGEE 11.04 |
| Example 9 (part by mass) | Synthesis Example 16 4.05 | ILP-113 0.12 | BTEAC 0.02 | PGMEA 8.86 | MIBC 16.85 | |
| Example 10 (part by mass) | Synthesis Example 10 7.54 | ILP-113 0.22 | TEA 0.03 | PGMEA 31.32 | PGME 20.88 | |
| Example 11 (part by mass) | Synthesis Example 17 6.75 | ILP-113 0.20 | BTEAC 0.04 | PGMEA 10.32 | MIBC 32.68 | |
| Example 12 (part by mass) | Synthesis Example 18 7.52 | ILP-113 0.22 | BTEAC 0.05 | PGMEA 31.32 | PGME 20.88 | |
| Example 13 (part by mass) | Synthesis Example 19 6.75 | ILP-113 0.20 | BTEAC 0.04 | PGMEA 10.75 | PGME 32.25 | |
| Comparative Example 3 (part by mass) | Comparative Synthesis Example 2 3.09 | ILP-113 0.09 | BTEAC 0.02 | PGMEA 12.80 | PGME 12.88 | PGEE 11.04 |
| Comparative Example 4 (part by mass) | Synthesis Example 1 1.38 | | BTEAC 0.01 | PGMEA 13.0 | PGME 5.58 | R-30N 0.01 |

TABLE 4

|  | Polymer | TAG | Curing catalyst | Solvent | |
|---|---|---|---|---|---|
| Example 14 (part by mass) | Synthesis Example 10 3.76 | TAG-2689 0.11 | BTEAC 0.02 | PGMEA 18.27 | PGME 7.83 |
| Example 15 (part by mass) | Synthesis Example 15 3.14 | TAG-2689 0.10 | BTEAC 0.02 | PGMEA 15.23 | PGME 6.53 |
| Comparative Example 5 (part by mass) | Comparative Synthesis Example 2 3.76 | TAG-2689 0.11 | BTEAC 0.02 | PGMEA 18.27 | PGME 7.83 |

(Evaluation of Photosensitivity and Developability)

Photosensitivity and developability of each of the polysiloxane compositions for coating in Example 3, Example 9, and Examples 10 to 13 were evaluated as follows. The evaluation results are listed in Table 5 and Table 6.

Each polysiloxane composition for coating was applied onto a wafer using a spin coater under conditions of a rotation speed of 1,500 rpm for 60 seconds and then the applied polysiloxane composition for coating was baked at 80° C. for 1 minute to form a photosensitive resin film. The film thickness was about 170 nm to about 190 nm. Subsequently, the sample was irradiated with broadband light from 10 mJ/cm$^2$ to 100 mJ/cm$^2$ or from 100 mJ/cm$^2$ to 200 mJ/cm$^2$ through an open mask of 1 cm×2 cm rectangle using an automatic exposure apparatus AE810e Mask Aligner manufactured by Sanmei Co., Ltd. equipped with Multi Light USH-250BY manufactured by USHIO Electric Co., Ltd. Thereafter, heating after irradiation of the irradiated sample was carried out at 80° C. for 1 minute on a hot plate. After cooling, the heated sample was developed using a 2.38% tetramethylammonium hydroxide aqueous solution as a development liquid. The film thicknesses (nm) of the composition after development are as listed in Table 5 and 6.

TABLE 5

| Exposure mount | Example 3 | Example 9 | Example 10 |
|---|---|---|---|
| 10 mJ/cm$^2$ | 5.0 nm or less | 5.0 nm or less | 5.0 nm or less |
| 20 mJ/cm$^2$ | 5.0 nm or less | 5.0 nm or less | 5.0 nm or less |
| 30 mJ/cm$^2$ | 5.0 nm or less | 5.0 nm or less | 5.0 nm or less |
| 40 mJ/cm$^2$ | 184.6 nm | 5.0 nm or less | 5.0 nm or less |
| 50 mJ/cm$^2$ | 181.7 nm | 185.4 nm | 5.0 nm or less |
| 60 mJ/cm$^2$ | 184.8 nm | 171.6 nm | 5.0 nm or less |
| 70 mJ/cm$^2$ | 184.7 nm | 187.4 nm | 5.0 nm or less |
| 80 mJ/cm$^2$ | 183.6 nm | 187.3 nm | 188.5 nm |
| 90 mJ/cm$^2$ | 182.0 nm | 185.6 nm | 193.4 nm |
| 100 mJ/cm$^2$ | 181.2 nm | 184.8 nm | 193.4 nm |

TABLE 6

| Exposure mount | Example 11 | Example 12 | Example 13 |
|---|---|---|---|
| 110 mJ/cm$^2$ | 5.0 nm or less | 5.0 nm or less | 5.0 nm or less |
| 120 mJ/cm$^2$ | 93.3 nm | 5.0 nm or less | 148.0 nm |
| 130 mJ/cm$^2$ | 184.0 nm | 133.1 nm | 183.3 nm |
| 140 mJ/cm$^2$ | 189.4 nm | 150.8 nm | 186.6 nm |
| 150 mJ/cm$^2$ | 190.9 nm | 159.0 nm | 187.7 nm |
| 160 mJ/cm$^2$ | 189.0 nm | 161.7 nm | 187.1 nm |
| 170 mJ/cm$^2$ | 188.9 nm | 165.5 nm | 186.1 nm |
| 180 mJ/cm$^2$ | 187.9 nm | 167.9 nm | 186.2 nm |
| 190 mJ/cm$^2$ | 188.4 nm | 170.5 nm | 186.8 nm |
| 200 mJ/cm$^2$ | 188.2 nm | 171.3 nm | 186.5 nm |

Under sufficient exposure conditions, it is considered that the silanol groups formed by decomposing the acetal groups with the acid generated from the photoacid generator due to exposure form polysiloxane bonds by heating after exposure and thus the polysiloxane film does not dissolve in the alkali development liquid and remains on the substrate. Therefore, it is considered that the polysiloxane composition exhibits photosensitivity.

In the case where the exposure is insufficient, it is considered that the acid is not sufficiently generated from the photoacid generator and thus the acetal groups are not decomposed and the polysiloxane film dissolves by the alkaline development liquid.

As listed in Tables 5 and 6, the siloxane coating films formed by using the compositions according to the present invention exhibit photosensitivity and excellent developability.

(Evaluation of Dry Etching Rate)

Each of the solutions of the compositions including the polysiloxanes of Example 3 to Example 13 and Comparative Example 3 was applied onto a wafer by using a spin coater at a rotation speed of 1,500 rpm for 60 seconds and then baked at 80° C. for 1 minute to form a resin film. Subsequently, the entire surface of the sample was irradiated with broadband light at 200 mJ/cm$^2$ using an automatic exposure apparatus AE810e Mask Aligner manufactured by Sanmei Co., Ltd. equipped with Multi Light USH-250BY manufactured by USHIO Electric Co., Ltd. The irradiated sample was heated at 215° C. for 1 minute on a hot plate to prepare a polysiloxane composition film (a film thickness was adjusted to 180 nm).

Each of the solutions of the compositions including the polysiloxanes of Example 14, Example 15, and Comparative Example 5 was applied onto a wafer by using a spin coater at a rotation speed of 1,500 rpm for 60 seconds and then baked at 215° C. for 1 minute on a hot plate to form a polysiloxane composition film (a film thickness was adjusted to 180 nm).

These coating films were dry etched and the etching rates using chlorine gas (etching rate: nm/min) were measured. The results are listed in Tables 7 and 8.

The etcher used for the measurement of the dry etching rate was LAM-2300 (manufactured by Lam Research Co., Ltd.).

TABLE 7

| | Etching rate with chlorine gas |
|---|---|
| Example 3 | 10.6 |
| Example 4 | 11.1 |
| Example 5 | 10.5 |
| Example 6 | 10.3 |
| Example 7 | 9.4 |

TABLE 7-continued

| | Etching rate with chlorine gas |
|---|---|
| Example 8 | 8.1 |
| Example 9 | 10.7 |
| Example 11 | 8.3 |
| Example 12 | 4.8 |
| Example 13 | 9.4 |
| Comparative Example 3 | 11.2 |

TABLE 8

| | Etching rate with chlorine gas |
|---|---|
| Example 14 | 11.8 |
| Example 15 | 10.0 |
| Comparative Example 5 | 13.4 |

As listed in Table 7 and 8, the siloxane coating films formed by using the compositions according to the present invention exhibit excellent etching resistance as compared with the siloxane coating films formed by using the compositions of the Comparative Examples. In the case where the composition is used as a coating composition or a resist composition, the composition exhibits excellent etching resistance during processing the substrate using the formed pattern.

(Evaluation of Planarization Property on Si Substrate)

For the polysiloxane compositions of Examples 3 and 14 and Comparative Example 4, the planarization property was evaluated as follows. The evaluation results are listed in Table 7.

The polysiloxane composition of Example 3 was applied onto a stepped substrate having a groove having a depth of 200 nm and a width of 800 nm using a spin coater at a rotation speed of 1,500 rpm for 60 seconds and then baked at 80° C. for 1 minute to form a photosensitive resin film. Subsequently, the entire surface of the sample was irradiated with broadband light at 100 mJ/cm$^2$ using an automatic exposure apparatus AE810e Mask Aligner manufactured by Sanmei Co., Ltd. equipped with Multi Light USH-250BY manufactured by USHIO Electric Co., Ltd. The irradiated sample was heated at 215° C. for 1 minute on a hot plate to prepare a polysiloxane composition film (a film thickness was adjusted to 120 nm). Similarly, each of the polysiloxane compositions of Example 14 and Comparative Example 4 was applied onto the stepped substrate and baked at 215° C. for 1 minute on a hot plate to form a polysiloxane composition film (a film thickness was adjusted to 120 nm). Subsequently, with respect to the obtained polysiloxane composition film, the sectional shape was observed with a sectional SEM to evaluate the planarization property. The groove pattern having a depth of 200 nm and a width of 800 nm was observed. The film thicknesses at the thinnest film thickness part and the thickest film thickness part were measured with reference to the groove bottom part and the film thickness difference was calculated. As the film thickness difference becomes smaller, the planarization property becomes more excellent.

TABLE 9

| | Film thickness difference |
|---|---|
| Example 3 | 124.2 nm |
| Example 14 | 144.1 nm |
| Comparative example 4 | 171.8 nm |

As listed in Table 9, the siloxane coating films formed by using the compositions according to the present invention exhibit the excellent planarization property as compared with the siloxane coating film formed by using the composition of the Comparative Example.

INDUSTRIAL APPLICABILITY

The present invention provides the composition including the acetal-protected polysiloxane that can be used as the coating composition that forms a flat film on a substrate to be processed and carries out pattern reversal and photosensitive composition.

The invention claimed is:
1. A coating composition or a photosensitive composition comprising:
   a polysiloxane obtained from a hydrolysis-condensation product of a hydrolyzable silane having 2 to 4 hydrolyzable groups in a molecule by protecting silanol groups of the condensation product with acetal groups, wherein
   acetal protection of the silanol groups is carried out using a vinyl ether of Formula (3)

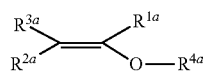
Formula (3)

in Formula (3), $R^{1a}$, $R^{2a}$, and $R^{1a}$ each are a hydrogen atom or a $C_{1-10}$ alkyl group; $R^{4a}$ is a $C_{1-10}$ alkyl group; and $R^{2a}$ and $R^{4a}$ optionally form a ring by bonding to each other, and
the hydrolyzable silane consists of at least one hydrolysable silane of Formula (1):

Formula (1)

in Formula (1), $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group and is bonded to a silicon atom through a Si—C bond; $R^2$ is an alkoxy group, an acyloxy group, or a halogen group; and a is an integer of 0 to 3 wherein the hydrolysis condensation product, an organic group bonded to the silicon atoms through Si—C bonds exists in a molar ratio of 0≤the organic group/(Si)≤0.29 on average.

2. The coating composition or the photosensitive composition according to claim 1, wherein the hydrolyzable silane of Formula (1) comprises any of a tetraalkoxysilane in which a is 0 in Formula (1), a methyltrialkoxysilane, a vinyltrialkoxysilane, or a phenyltrialkoxysilane in which a is 1 in Formula (1), or dimethyldialkoxysilane in which a is 2 in Formula (1).

3. The coating composition or the photosensitive composition according to claim 1, wherein the hydrolyzable silane comprises a hydrolyzable silane in which a is 0 in Formula (1) in a ratio of 71 mol % to 100 mol % and a hydrolyzable silane in which a is 1 in Formula (1) in a ratio of 0 mol % to 29 mol %.

4. The coating composition or the photosensitive composition according to claim 1, wherein the hydrolyzable silane comprises a hydrolyzable silane in which a is 0 in Formula (1) in a ratio of 85.5 mol % to 100 mol % and a hydrolyzable silane in which a is 2 in Formula (1) in a ratio of 0 mol % to 14.5 mol %.

5. The coating composition or the photosensitive composition according to claim 1, wherein the vinyl ether of Formula (3) is ethyl vinyl ether, propyl vinyl ether, butyl vinyl ether, ethylhexyl vinyl ether, cyclohexyl vinyl ether, 3,4-dihydro-2H-pyran, or 2,3-dihydrofuran.

6. The coating composition according to claim 1, further comprising a thermal acid generator or a photoacid generator, wherein
   the coating composition is applied onto a resist pattern or onto an organic underlayer film to which the resist pattern is transferred.

7. The coating composition according to claim 1, further comprising one or more compounds selected from the group consisting of water, an acid, a quencher, and a curing catalyst.

8. A resist composition formed by further comprising a photoacid generator in the coating composition according to claim 1.

9. A method for producing a semiconductor device, the method comprising the steps of:
   (i) forming a resist film on a semiconductor substrate using the resist composition according to claim 8;
   (ii) exposing the resist film and developing the resist after the exposure to obtain a resist pattern; and
   (iii) processing the substrate using the patterned resist film.

10. A method for producing a semiconductor device, the method comprising the steps of:
   (I) forming a pattern on a semiconductor substrate by a nano-imprinting method;
   (II) applying the coating composition according to claim 1 onto the pattern to embed the polysiloxane;
   (III) curing the embedded polysiloxane and then etching or ashing the pattern formed by the nano-imprinting method to reverse the pattern; and
   (IV) processing the substrate using the polysiloxane film.

11. A method for producing a semiconductor device, the method comprising the steps of:
   (A) forming a resist film on a semiconductor substrate;
   (B) exposing the resist film and developing the resist after the exposure to obtain a resist pattern;
   (C) applying the coating composition according to claim 1 onto the patterned resist film to embed the polysiloxane;
   (D) curing the embedded polysiloxane and then etching or ashing the resist film to reverse the pattern; and
   (E) processing the substrate using the polysiloxane film.

12. A method for producing a semiconductor device, the method comprising the steps of:
   (a) forming an organic underlayer film on a semiconductor substrate;
   (b) applying a silicon hard mask forming composition onto the organic underlayer film and baking the applied silicon hard mask forming composition to form a silicon hard mask;
   (c) applying a composition for a resist onto the silicon hard mask to form a resist layer;
   (d) exposing the resist film and developing the resist after the exposure to obtain a resist pattern;
   (e) applying the coating composition according to claim 1 onto the resist pattern to embed the polysiloxane;
   (f) curing the embedded polysiloxane and then etching or ashing the resist film to reverse the pattern;

(g) etching the silicon hard mask using the reversed pattern;
(h) etching the organic underlayer film using the patterned silicon hard mask to form a patterned organic underlayer film; and
(i) processing the substrate using the patterned organic underlayer film.

13. A method for producing a semiconductor device, the method comprising the steps of:
(1) forming an organic underlayer film on a semiconductor substrate;
(2) applying a silicon hard mask forming composition onto the organic underlayer film and baking the applied silicon hard mask forming composition to form a silicon hard mask;
(3) applying a composition for a resist onto the silicon hard mask to form a resist layer;
(4) exposing the resist film and developing the resist after the exposure to obtain a resist pattern;
(5) etching the silicon hard mask using the resist pattern;
(6) etching the organic underlayer film using the patterned silicon hard mask to form a patterned organic underlayer film;
(7) applying the coating composition according to claim 1 onto the patterned organic underlayer film to embed the polysiloxane;
(8) curing the embedded polysiloxane and then etching or ashing the organic underlayer film to reverse the pattern; and
(9) processing the substrate using the polysiloxane film.

* * * * *